United States Patent
Woo et al.

(10) Patent No.: US 11,793,002 B2
(45) Date of Patent: Oct. 17, 2023

(54) RESISTIVE MEMORY DEVICE WITH MAGNETIC LAYER HAVING TOPOLOGICAL SPIN TEXTURES FOR TUNING

(71) Applicant: International Business Machines Corporation, Armonk, NY (US)

(72) Inventors: Seonghoon Woo, New York, NY (US); Seyoung Kim, Pohang (KR); Mingu Kang, Old Tappan, NJ (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 17/308,499

(22) Filed: May 5, 2021

(65) Prior Publication Data
US 2022/0359617 A1 Nov. 10, 2022

(51) Int. Cl.
*H10B 63/00* (2023.01)
*G11C 11/16* (2006.01)
*H10N 50/10* (2023.01)
*H10N 50/85* (2023.01)

(52) U.S. Cl.
CPC .......... *H10B 63/30* (2023.02); *G11C 11/1673* (2013.01); *G11C 11/1675* (2013.01); *H10N 50/10* (2023.02); *H10N 50/85* (2023.02)

(58) Field of Classification Search
CPC . H10B 63/30; G11C 11/1673; G11C 11/1675; H10N 50/85; H10N 50/10
USPC ........................................................... 257/4
See application file for complete search history.

(56) References Cited

U.S. PATENT DOCUMENTS

| | | | |
|---|---|---|---|
| 9,653,136 | B2 | 5/2017 | Cros et al. |
| 2019/0074044 | A1 | 3/2019 | Atulasimha et al. |
| 2020/0043981 | A1 | 2/2020 | Wang et al. |
| 2020/0212104 | A1 | 7/2020 | Sonobe |
| 2022/0044103 | A1* | 2/2022 | Nguyen ................ H10B 61/00 |

FOREIGN PATENT DOCUMENTS

| | | |
|---|---|---|
| CN | 111446361 A | 7/2020 |
| CN | 112563411 A | 3/2021 |

OTHER PUBLICATIONS

Z. Yu et al., "Voltage-Controlled Skyrmion-Based Artificial Synapse in a Synthetic Antiferromagnet," arXiv:1906.09758, Jun. 2019, 11 pages.
S. Li et al., "Magnetic Skyrmion-Based Artificial Neuron Device," Nanotechnology, Jul. 14, 2017, vol. 28, No. 31, 8 pages.
B. Pan et al., "Skyrmion-Induced Memristive Magnetic Tunnel Junction for Ternary Neural Network," Journal of the Electron Devices Society, Apr. 26, 2019, vol. 7, pp. 529-533.
(Continued)

*Primary Examiner* — Jami Valentine Miller
(74) *Attorney, Agent, or Firm* — Erik Johnson; Ryan, Mason & Lewis, LLP

(57) ABSTRACT

A resistive memory device includes a magnetic tunnel junction structure. The magnetic tunnel junction structure includes a free magnetic layer. The free magnetic layer includes a magnetic material configurable to host topological spin textures to tune a conductance state of the resistive memory device.

20 Claims, 10 Drawing Sheets

(56) References Cited

OTHER PUBLICATIONS

X. Zhang et al., "Skyrmions in Magnetic Tunnel Junctions," ACS Applied Materials & Interfaces, Apr. 23, 2018, vol. 10, No. 19, 28 pages.
Y. Huang et al., "Magnetic Skyrmion-Based Synaptic Devices," Nanotechnology, Jan. 23, 2017, vol. 28, No. 8, 5 pages.
K. M. Song et al., "Magnetic Skyrmion Artificial Synapse for Neuromorphic Computing," eprint arXiv:1907.00957, Jul. 2019, 11 pages.
S. Lequeux et al., "A Magnetic Synapse: Multilevel Spin-Torque Memristor with Perpendicular Anisotropy," Scientific Reports, Aug. 19, 2016, vol. 6, 7 pages.
N. Locatelli et al., "Spin Torque Building Blocks," Nature Materials, Jan. 13, 2014, vol. 13, No. 1, 15 pages.
X. Z. Yu et al., "Real-Space Observation of a Two-Dimensional Skyrmion Crystal," Nature, Jun. 17, 2010, vol. 465, pp. 901-904.
P. Mell et al., "The NIST Definition of Cloud Computing," Recommendations of the National Institute of Standards and Technology, Special Publication 800-145, Sep. 2011, 7 pages.
International Search Report and Written Opinion of PCT/CN2022/087835, dated Jul. 6, 2022, 8 pages.

\* cited by examiner

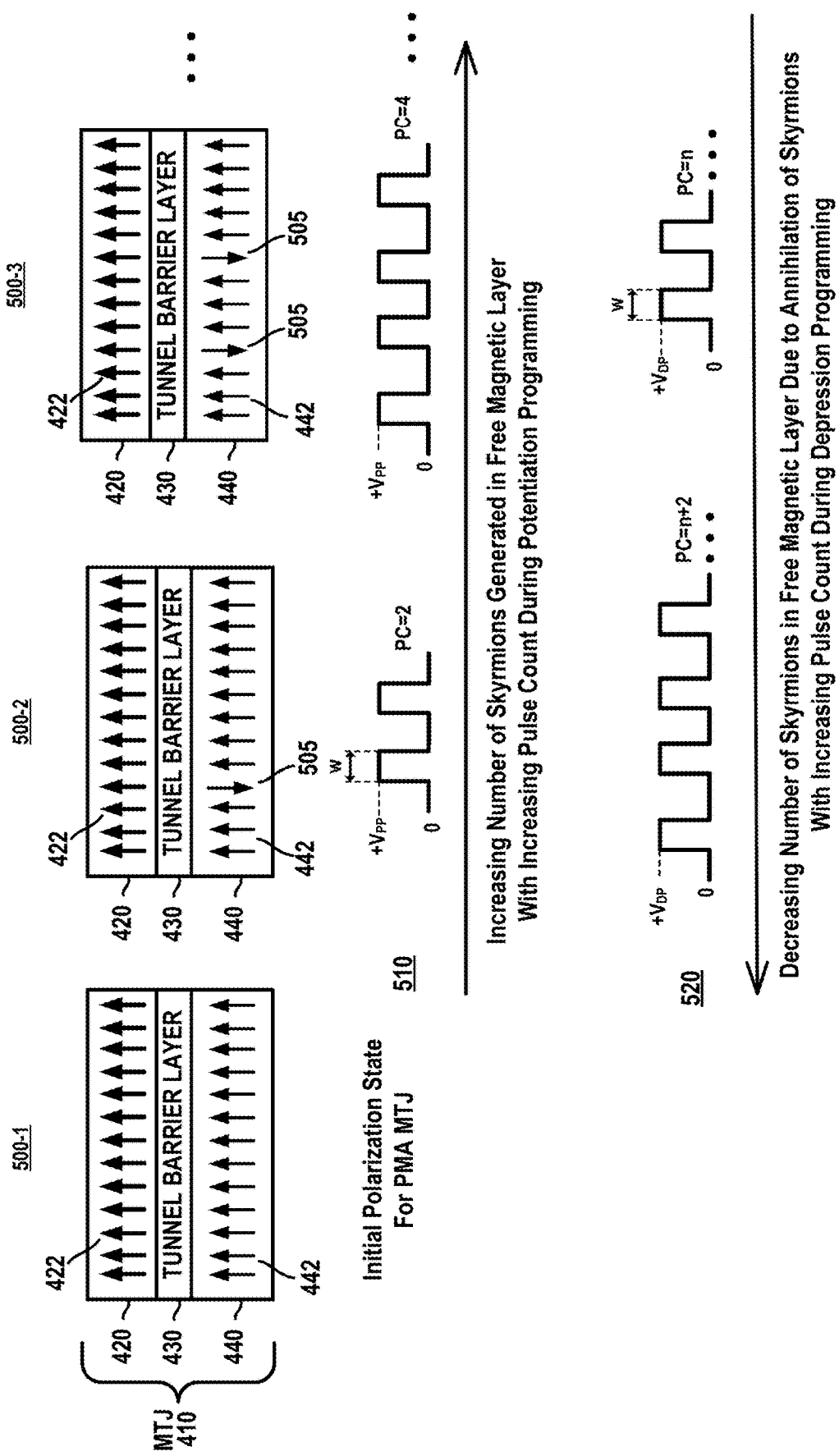

600

700

RESISTIVE MEMORY DEVICE WITH MAGNETIC LAYER HAVING TOPOLOGICAL SPIN TEXTURES FOR TUNING

BACKGROUND

This disclosure relates generally to non-volatile analog resistive memory cells for neuromorphic computing, and techniques for conductance tuning of resistive memory devices of non-volatile analog resistive memory cells. Information processing systems such as neuromorphic computing systems and artificial neural network systems are utilized in various applications such as machine learning and inference processing for cognitive recognition and computing. Such systems are hardware-based systems that generally include a large number of highly interconnected processing elements (referred to as "artificial neurons") that operate in parallel to perform various types of computations. The artificial neurons (e.g., pre-synaptic neurons and post-synaptic neurons) are connected using artificial synaptic devices which provide synaptic weights that represent connection strengths between the artificial neurons. The synaptic weights can be implemented using analog memory elements, such as tunable resistive memory devices, which exhibit non-volatile and multi-level memory characteristics.

SUMMARY

Embodiments of the disclosure include resistive memory devices with magnetic layers that are configured to host topological spin textures, such as magnetic skyrmions, to enable conductance tuning of the resistive memory devices, and non-volatile resistive memory cells and computing systems which implement such resistive memory devices.

In an exemplary embodiment, a resistive memory device comprises a magnetic tunnel junction structure. The magnetic tunnel junction structure comprises a free magnetic layer. The free magnetic layer comprises a magnetic material configurable to host topological spin textures to tune a conductance state of the resistive memory device.

Other embodiments will be described in the following detailed description of exemplary embodiments, which is to be read in conjunction with the accompanying figures.

BRIEF DESCRIPTION OF THE DRAWINGS

FIG. 5A schematically illustrates potentiation and depression programming operations for generating and annihilating magnetic skyrmions in a magnetic skyrmion resistive memory device, according to an exemplary embodiment of the disclosure.

DETAILED DESCRIPTION

Figure 1:
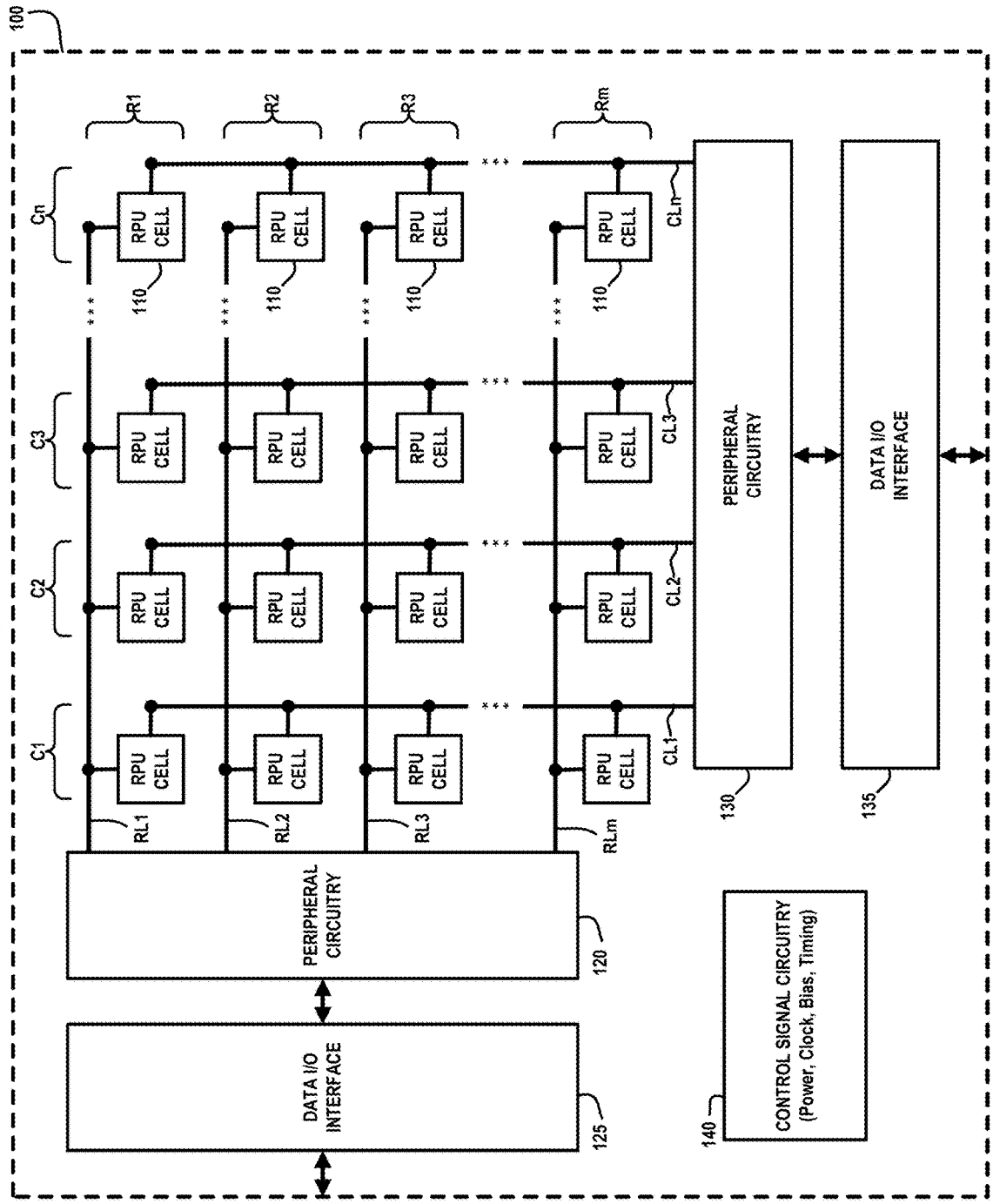
FIG. 1 schematically illustrates a resistive processing unit (RPU) computing system which comprises an array of non-volatile resistive memory cells that can be implemented using magnetic skyrmion resistive memory devices, according to an exemplary embodiment of the disclosure.

Embodiments of the disclosure will now be described in further detail with regard to resistive memory devices with magnetic layers that are configured to host topological spin textures, such as magnetic skyrmions, to enable conductance tuning of the resistive memory devices, and non-volatile resistive memory cells and computing systems which implement such resistive memory devices. As explained in further detail below, exemplary embodiments of the disclosure include multi-state resistive memory devices which implement free magnetic layers that are configured to host topological spin textures, such as magnetic skyrmions, wherein the states of such resistive memory devices are modulated using programming current to generate or annihilate topological spin textures of the free magnetic layer. As is known in the art, a magnetic skyrmion is a type of swirling magnetic texture that exhibits topological characteristics, and in particular, a non-collinear configuration of magnetic moments with a whirling magnetic structure. For illustrative purposes, exemplary embodiments of the disclosure will be discussed with reference to skyrmion-based resistive memory devices (or more generally, skyrmion resistive memory devices) which utilize magnetic skyrmion formation/annihilation in a free magnetic layer of a magnetic tunnel junction structure of the resistive memory devices to modulate a magnetoresistance of the resistive memory device. However, it is to be understood that the same or similar techniques as disclosed herein can be utilized to implement multi-state resistive memory devices with free magnetic layers that are capable of hosting one of various types of stable topological spin textures, which are suitable for the given application.

It is to be understood that the various features as shown in the accompanying drawings are schematic illustrations that are not drawn to scale. In addition, for ease of illustration and explanation, one or more layers, structures, regions, features, etc., of a type commonly used to implement resistive memory devices, and other devices or structures and system components as schematically shown in the drawings, may not be explicitly shown in a given drawing. This does not imply that any layers, structures, regions, features, etc., not explicitly shown are omitted from the actual devices or structure. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration". Any embodiment or design described herein as "exemplary" is not to be construed as preferred or advantageous over other embodiments or designs. The word "over" as used herein to describe the orientation of a given feature with respect to another feature means that the given feature may be disposed or formed "directly on" (i.e., in direct contact with) the other feature, or that the given feature may be disposed or formed "indirectly on" the other feature with one or more intermediate features disposed between the given feature and the other feature.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., ASICs, FPGAs, etc.), processing devices (e.g., CPUs, GPUs, etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

Exemplary embodiments of the disclosure include computing systems or computational memory systems, which utilize an array of non-volatile analog memory cells for a dual purpose of storing data and processing the data to perform some computational tasks. In some embodiments, the non-volatile analog memory cells (e.g., resistive processing units) implement magnetic skyrmion resistive memory devices. which have a tunable conductance (G) with variable conductance states over a range from a min conductance (Gmin) to a maximum conductance (Gmax). Exemplary embodiments of magnetic skyrmion resistive memory devices and non-volatile memory cells which implement magnetic skyrmion resistive memory devices as storage elements, will be discussed in further detail below in conjunction with FIGS. 3, 4, 6, 7, 8, and 9. As noted above, neuromorphic computing systems and artificial neural network systems are types of in-memory computing systems in which artificial neurons are connected using artificial synaptic devices to provide synaptic weights which represent the strength of connection between two artificial neurons. The synaptic weights can be implemented using tunable magnetic skyrmion resistive memory devices as disclosed herein, where the variable conductance states of the magnetic skyrmion resistive memory devices are used to represent the synaptic weights and to perform computations. The conductance states of the magnetic skyrmion resistive memory devices can be encoded or otherwise mapped to synaptic weights.

Various types of artificial neural networks, such as deep neural networks (DNNs) and convolutional neural networks (CNNs) implement neuromorphic computing architectures for machine learning applications such as image recognition, object recognition, speech recognition, etc. The in-memory computations associated with such neural networks include, e.g., training computations in which the synaptic weights of the resistive memory cells are optimized by processing a training dataset, and forward inference computations in which the trained neural networks are used to process input data for purposes of, e.g., classifying the input data, predicting events based on the input data, etc.

DNN training generally relies on a backpropagation algorithm which includes three repeating cycles: forward, backward and weight update, which are repeated many times until a convergence criterion is met. The forward and backward cycles mainly involve computing vector-matrix multiplication in forward and backward directions. This operation can be performed on a 2D array of analog resistive memory cells. In a forward cycle, stored conductance values of the resistive memory devices in the 2D array form a matrix, and an input vector is transmitted as voltage pulses through each input rows of the 2D array to perform a matrix-vector multiplication operation. In a backward cycle, voltage pulses are supplied from columns as an input, and a matrix-vector product is computed on the transpose of the matrix. The weight update involves calculating a vector-vector outer product which consists of a multiplication operation and an incremental weight update to be performed locally in each resistive memory cell within the 2D array.

A stochastically trained DNN comprising arrays of RPU cells can have synaptic weights implemented using tunable magnetic skyrmion resistive memory devices according to exemplary embodiments of the disclosure. To properly train a DNN and achieve high-accuracy, the operating characteristics of tunable resistive devices should meet a stringent set of specifications of acceptable RPU device parameters that a given DNN algorithm can tolerate without significant error penalty. These specifications include, for example, variations in the switching characteristics of the resistive memory device, such as, minimum incremental conductance change ($\pm \Delta g_{min}$) due to a specified number (e.g., one or more) potentiation/depression pulses, symmetry in up and down conductance changes, tunable range of the conductance values, etc. In particular, one important specification for DNN training is that the RPU cells should have a tunable conductance with a resolution (or dynamic range) of a relatively large number (e.g., 100, 1000, or more) conductance levels (or steps), wherein the conductance levels can be switched (via 1-ns pulses) from a lowest conductance state to a highest conductance state in an analog and symmetrically incremental manner (with at least one order of magnitude of conductance difference between the maximum and minimum conductance state (on/off ratio)). To achieve symmetry of up/down changes of a minimum unit weight value ($\pm \Delta w_{min}$) in an RPU cell, each incremental increase (step up, $\Delta g_{min}^+$) and incremental decrease (step down, $\Delta g_{min}^-$) in the associated conductance level of the RPU cell should be the same amount or a similar amount within no more than 5% mismatch error. In other words, tunable resistive RPU devices, which are analog in nature, should respond symmetrically in up and down conductance changes when provided the same but opposite pulse stimulus. In particular, the up/down symmetry, $$\frac{\Delta g_{min}^+}{\Delta g_{min}^-},$$

should be equal to 1.0±0.05. It is to be noted that the parameter $\Delta g_{min}^{\pm}$ is proportional to the parameter $\Delta w_{min}^{\pm}$ through an amplification factor defined by the peripheral circuitry.

Despite these requirements, however, tunable resistive devices can exhibit limited dynamic range and resolution, as well as variability in tuning/programming characteristics, making it difficult to achieve symmetric weight updates over the range (min-max) of conductance levels. As such, the hardware implementation of the RPU architecture is non-trivial. More specifically, in reality, most resistive memory devices do not show symmetric switching behavior, but rather exhibit a highly non-linear evolution of conductance as a function of the number of consecutively applied pulses. This results in significant errors in weight updates. On the other hand, linearity of the resistance change, representing the identical incremental tuning of synaptic weight with the repetition of input pulses, is highly desired for fast learning with simple neuron circuit operation by determining the synaptic weight change using only a pulse count number. The symmetric tuning of synaptic weight for synaptic potentiation and depression is also preferred because it allows the neuron circuit to generate voltage pulses with the same amplitude and duration (e.g., referred to as an identical programming pulse scheme) but opposite polarities for potentiation and depression.

FIG. 1 schematically illustrates a resistive processing unit (RPU) computing system which comprises an array of non-volatile resistive memory cells that can be implemented using magnetic skyrmion resistive memory devices, according to an exemplary embodiment of the disclosure. In particular, FIG. 1 schematically illustrates a neuromorphic computing system which is implemented using a crossbar arrays of resistive processing units. The computing system 100 comprises a two-dimensional (2D) crossbar array of RPU cells 110 arranged in a plurality of rows R1, R2, R3, . . . , Rm, and a plurality of columns C1, C2, C3, . . . , Cn. The RPU cells 110 in each row R1, R2, R3, . . . , Rm are commonly connected to respective row control lines RL1, RL2, RL3, . . . , RLm (collectively, row control lines RL). The RPU cells 110 in each column C1, C2, C3, . . . , Cn are commonly connected to respective column control lines CL1, CL2, CL3, . . . , CLn (collectively, column control lines CL). Each RPU cell 110 is connected at (and between) a cross-point (or intersection) of a respective row line and column line. In one example embodiment, the RPU system 100 comprises a 4,096×4,096 array of RPU cells 110.

The computing system 100 further comprises peripheral circuitry 120 connected to the row control lines RL1, RL2, RL3, . . . , RLm, as well peripheral circuitry 130 connected to the column control lines CL1, CL2, CL3, . . . , CLn. Further, the peripheral circuitry 120 is connected to a data input/output (I/O) interface block 125, and the peripheral circuitry 130 is connected to a data I/O interface block 135. The computing system 100 further comprises control signal circuitry 140 which comprises various types of circuit blocks such as power, clock, bias and timing circuitry to provide power distribution and control signals and clocking signals for operation of the computing system 100.

In some embodiments, each RPU cell 110 in the computing system 100 comprises a non-volatile resistive memory cell which comprises an access transistor and a magnetic skyrmion resistive memory device which serves as a storage element of the non-volatile resistive memory cell. In some embodiments, the RPU cells 110 are implemented using an exemplary non-volatile resistive memory cell framework as will be discussed in further detail below in conjunction with FIG. 3. Furthermore, in some embodiments, the RPU cells 110 implement magnetic skyrmion resistive memory devices having one of the exemplary embodiments of magnetic skyrmion resistive memory device frameworks as schematically illustrated in FIG. 4, 6, 7, 8, or 9, which will be discussed in further detail below.

In a neuromorphic computing application, the RPU cells 110 comprise artificial synapses that provide weighted connections between pre-neurons and post-neurons. Multiple pre-neurons and post-neurons are connected through the 2D crossbar array of RPU cells 110, which naturally expresses a fully-connected neural network. In some embodiments, the computing system 100 is configured to perform DNN or CNN computations wherein a conductance of each RPU cell 110 represents a matrix element or weight $w_{ij}$, which can be updated or accessed through operations of the peripheral circuitry 120 and 130 (wherein $w_{ij}$ denotes a weight value for the $i^{th}$ row and the $j^{th}$ column in the array of RPU cells 110). Typically, a DNN is trained using a simple stochastic gradient decent (SGD) scheme, in which an error gradient with respect to each parameter is calculated using a backpropagation algorithm which comprises three repeating cycles: a forward cycle, a backward cycle, and a weight update cycle. The computing system 100 can be configured to perform all three cycles of the backpropagation process in parallel, thus potentially providing significant acceleration in DNN training with lower power and reduced computation resources. The computing system 100 can be configured to perform matrix-vector multiplication operations in the analog domain in a parallel manner.

While the row control lines RL and column control lines CL are each shown in FIG. 1 as a single line for ease of illustration, it is to be understood that each row and column control line can include two or more control lines connected to the RPU cells 110 in the respective rows and columns, depending on the implementation and the specific architecture of the RPU cells 110. For example, in some embodiments, each row control line RL can include a single word line (WL) or a complementary pair of word lines for a given RPU cell 110, depending on the configuration of the RPU cells. Moreover, each column control line CL may comprise multiple control lines including, e.g., one or more source lines (SL) and one or more bit lines (BL).

The peripheral circuitry 120 and 130 comprises various circuit blocks which are connected to the respective rows and columns in the 2D array of RPU cells 110, and which are configured to perform vector-matrix multiply functions, matrix-vector multiply functions, and outer product update operations to implement the forward, backward and weight update operations of a backpropagation process (for neural network training), as well inference processing using a trained neural network. For example, in some embodiments, to support RPU cell read/sensing operations (e.g., read a weight value of given RPU cell 110), the peripheral circuitry 120 and 130 comprises pulse-width modulation (PWM)

circuitry and read pulse driver circuitry to generate and apply PWM read pulses to the RPU cells 110, in response to input vector values (read input values) received during forward/backward cycles.

More specifically, in some embodiments, the peripheral circuitry 120 and 130 comprises digital-to-analog (D/A) converter circuitry that is configured to receive digital input vectors (to be applied to rows or columns) and convert the digital input vector into analog input vector values that are represented by input voltage voltages of varying pulse width. In some embodiments, a time-encoding scheme is used when input vectors are represented by fixed amplitude Vin=1 V pulses with a tunable duration (e.g., pulse duration is a multiple of 1 ns and is proportional to the value of the input vector). The input voltages applied to rows (or columns) generate output vector values which are represented by output currents, wherein the weights of the RPU cells 110 are read out by measuring the output currents.

The peripheral circuitry 120 and 130 further comprises current integrator circuitry and analog-to-digital (A/D) converter circuitry to integrate read currents ($I_{READ}$) which are output and accumulated from the connected RPU cells 110 and convert the integrated currents into digital values (read output values) for subsequent computation. In particular, the currents generated by the RPU cells 110 are summed on the columns (or rows) and this total current is integrated over a measurement time, tmeas, by current readout circuitry of the peripheral circuitry 120 and 130. The current readout circuitry comprises current integrators and analog-to-digital (A/D) converters. In some embodiments, each current integrator comprises an operational amplifier that integrates the current output from a given column (or row) (or differential currents from pairs of RPU cells implementing negative and positive weights) on a capacitor, and an analog-to-digital (A/D) converter converts the integrated current (e.g., an analog value) to a digital value.

Furthermore, the peripheral circuitry 120 and 130 comprises voltage generator and driver circuitry that is configured to generate programming voltages that are used during programming operations to tune the conductance states of magnetic skyrmion resistive memory devices that are implemented in the RPU cells. In some embodiments, the peripheral circuitry 120 and 130 is configured to generate control signals and programming pulses on word lines, bit lines and source lines of the RPU system 100 to perform the exemplary programming operations as discussed in further detail below the reference to FIGS. 3, 4 and 5A.

The data I/O interfaces 125 and 135 are configured to interface with a digital processing core, wherein the digital processing core is configured to process input/outputs to the computing system 100 (neural core) and route data between different RPU arrays. The data I/O interfaces 125 and 135 are configured to (i) receive external control signals and data from a digital processing core and provide the received control signals and data to the peripheral circuitry 120 and 130, and (ii) receive digital read output values from peripheral circuitry 120 and 130, and send the digital read output values to a digital processing core for processing. In some embodiments, the digital processing core implements a non-linear function circuitry which calculates activation functions (e.g., sigmoid neuron function, softmax, etc.) and other arithmetical operations on data that is to be provided to a next or previous layer of a neural network.

Figure 2:
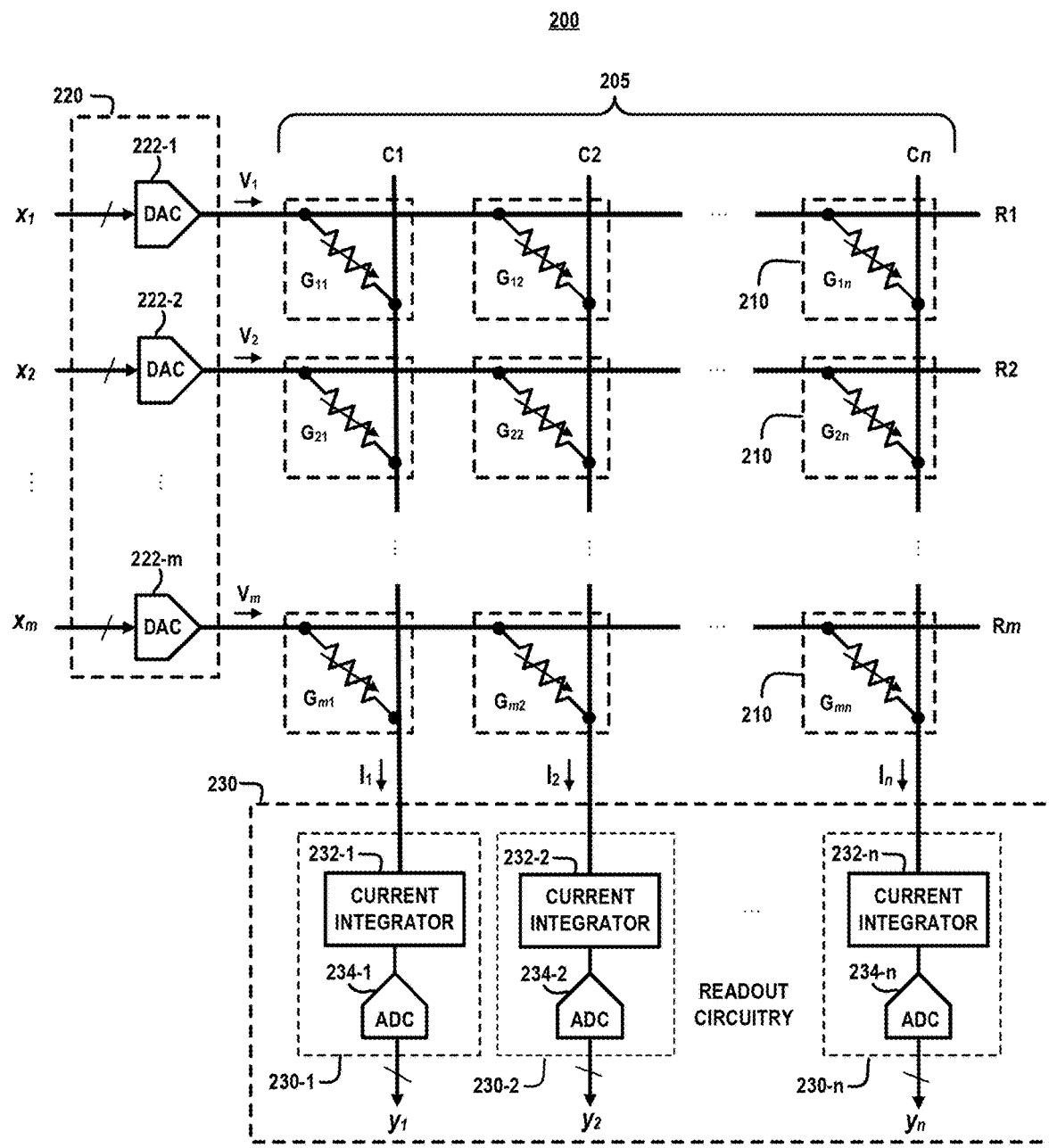
FIG. 2 schematically illustrates an exemplary configuration of an RPU system for performing in-memory computing operations, according to an exemplary embodiment of the disclosure.

FIG. 2 schematically illustrates an exemplary configuration of an RPU system for performing in-memory computing operations, according to an exemplary embodiment of the disclosure. In particular, FIG. 2 schematically illustrates an RPU computing system 200 which comprises a crossbar array of RPU cells 205 (or RPU array 205). In some embodiments, each RPU cell 210 in the RPU array 205 implements a magnetic skyrmion resistive memory device as a storage element of the RPU cell 210. In FIG. 2, each storage element of the RPU cells 210 is represented as a variable resistor having a tunable conductance G at the intersection of each row (R1, R2, ..., Rm) and column (C1, C2, ..., Cn). As depicted in FIG. 2, the array of RPU cells 205 provides a matrix of conductance values Gij which are mapped to, e.g., matrix values, weight of artificial synaptic device, etc., which are encoded by the conductance values Gij (where i represents a row index and j denotes a column index) of the respective RPU cells 210.

FIG. 2 illustrates an exemplary configuration in which multiplexers in the peripheral circuitry of the computing system 200 are activated to selectively connect line driver circuitry 220 to the row lines R1, R2, ..., Rn. The line driver circuitry 220 comprises plurality of digital-to-analog (DAC) circuit blocks 222-1, 222-2, ..., 222-m (collectively DAC circuit blocks 222) which are connected to respective row lines R1, R2, ..., Rn. In addition, multiplexers in the peripheral circuitry of the computing system 200 are activated to selectively connect readout circuitry 230 to the column lines C1, C2, ..., Cn. The readout circuitry 230 comprises a plurality of readout circuit blocks 230-1, 230-2, ..., 230-n, which are connected to respective column lines C1, C2, ..., Cn. The readout circuit blocks 230-1, 230-2, ..., 230-n comprise respective current integrator circuitry 232-1, 232-2, ..., 232-n, and respective analog-to-digital (ADC) circuitry 234-1, 234-2, ..., 234-n. The current integrator circuitry comprises current integrator circuit blocks, wherein each current integrator comprises an operational transconductance amplifier (OTA) with negative capacitive feedback to convert an input current (aggregate column current) to an output voltage on output node of the current integrator circuit, wherein at the end of an integration period, each ADC circuit latches in the output voltage generated at an output node of a respective current integrator circuit quantizes the output voltage to generate a digital output signal.

FIG. 2 illustrates an exemplary matrix-vector multiplication process that can be implemented to multiply a matrix of weights (which are encoded by the conductance values Gij) by a digital input vector $X=(x_1, x_2, \ldots, x_m)$ to generate a resulting output vector $Y=(y_1, y_2, \ldots, y_n)$. The elements $x_1, x_2, \ldots, x_m$ of the input vector X are input to respective DAC circuit blocks 222-1, 222-2, ..., 222-m, which generate analog voltages $V_1, V_2, \ldots, V_m$ at the input to the respective row lines R1, R2, ..., $R_m$. The analog voltages $V_1, V_2, \ldots, V_m$ are proportional to the values of the input vector elements $x_1, x_2, \ldots, x_m$, respectively. In some embodiments, the DAC circuit blocks 222-1, 222-2, ..., 222-m each comprise pulse-width modulation circuitry and driver circuitry which is configured to generate pulse-width modulated (PWM) read pulses $V_1, V_2, \ldots, V_m$ that are applied to the respective row lines R1, R2, ..., Rm.

More specifically, in some embodiments, the DAC circuit blocks 222-1, 222-2, ..., 222-m are configured to perform a digital-to-analog conversion process using a time-encoding scheme where the input vectors are represented by fixed amplitude pulses (e.g., V=1V) with a tunable duration, wherein the pulse duration is a multiple of a prespecified time period (e.g., 1 nanosecond) and is proportional to the value of the input vector. For example, a given digital input value of 0.5 can be represented by a voltage pulse of 4 ns, while a digital input value of 1 can be represented by a voltage pulse of 80 ns (e.g., a digital input value of 1 can be encoded to an analog voltage pulse with a pulse duration that is equal to the integration time $T_{meas}$). As shown in FIG. 2, the resulting analog input voltages $V_1, V_2, \ldots, V_m$ (e.g., PWM pulses), are applied to the array of RPU cells 205 via the row lines R1, R2, . . . , Rm.

To perform a matrix-vector multiplication, the analog input voltages $V_1, V_2, \ldots, Vm$, are applied to the row lines R1, R2, . . . , Rm, wherein each RPU cell 210 generates a corresponding read current $I_{READ}=V_i \times G_{ij}$ (based on Ohm's law), wherein $V_i$ denotes the analog input voltage applied to the given RPU cell 210 on the given row i and wherein Gij denotes the conductance value of the given RPU cell 210 (at the given row i and column j). As shown in FIG. 2, the read currents that are generated by the RPU cells 210 on each column j are summed together (based on Kirchhoff's current law) to generate respective currents $I_1, I_2, \ldots, I_n$ at the output of the respective columns C1, C2, . . . , Cn. In this manner, the resulting column currents $I_1, I_2, \ldots, I_n$ represent the result of a matrix-vector multiplication operation.

The resulting aggregate read currents $I_1, I_2, \ldots, I_n$ at the output of the respective columns C1, C2, . . . , Cn are input to respective readout circuit blocks 230-1, 230-2, . . . , 230-n of the readout circuitry 230. The aggregate read currents $I_1, I_2, \ldots, I_n$ are integrated by the respective current integrator circuits 232-1, 232-2, . . . , 232-n to generate respective output voltages, which are quantized by the respective ADC circuits 234-1, 234-2, . . . , 234-n to generate respective digital output signals $y_1, y_2, \ldots, y_n$ of the resulting output vector Y (which represents the result of the matrix-vector multiplication operation).

Figure 3:
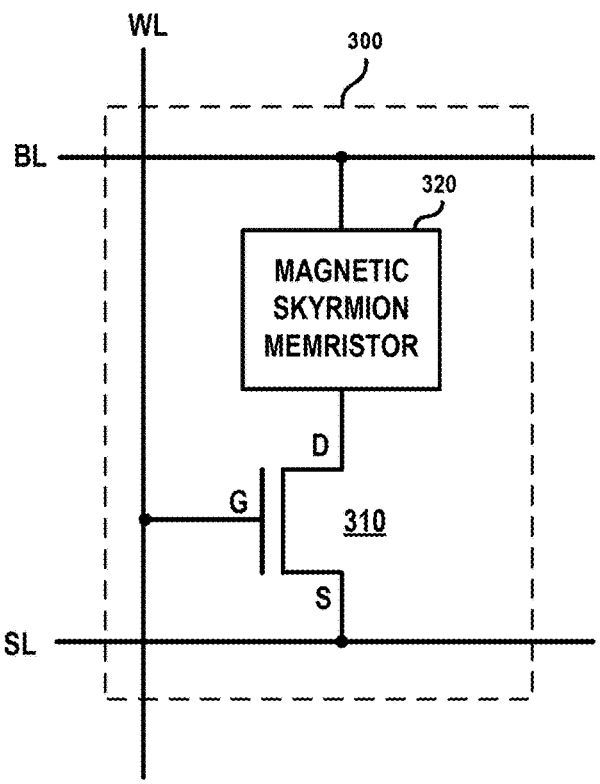
FIG. 3 schematically illustrates an analog resistive memory cell which implements a magnetic skyrmion resistive memory device, according to an exemplary embodiment of the disclosure.

FIG. 3 schematically illustrates an analog resistive memory cell which implements a magnetic skyrmion resistive memory device, according to an exemplary embodiment of the disclosure. In particular, FIG. 3 schematically illustrates a non-volatile analog resistive memory cell 300 which comprises an access transistor 310, and a magnetic skyrmion resistive memory device 320 (or magnetic skyrmion memristor device). The memory cell 300 comprises a 1T-1R architecture where the transistor 310 operates as a select transistor for the memory cell 300, and the magnetic skyrmion resistive memory device 320 operates as a storage element for the memory cell 300. In some embodiments, the resistive memory device 320 comprises a two-terminal programmable resistive memory element having a magnetic layer, wherein the resistive memory device 320 is programmable to have one of a plurality of different conductive states, wherein the number n of conductance states is 4 or more (e.g., n≥4), or, more preferably, 100 or more conductance states e.g., n≥100), which can be tuned by increasing or decreasing the number of magnetic skyrmions that are present in the magnetic layer.

As shown in FIG. 3, the access transistor 310 (alternatively referred to herein as select transistor 310) comprises a gate G terminal, a drain D terminal, and a source S terminal. The gate G terminal is coupled to a word line WL, the source S terminal is coupled to a source line SL, and the drain D terminal is coupled to a first terminal of the resistive memory device 320. The resistive memory device 320 comprises a second terminal that coupled to a bit line BL. In this regard, the resistive memory device 320 is connected between the bit line BL and the drain D terminal of the access transistor 310. The memory cell 300 can be implemented as, e.g., an RPU cell of the computing system 100 (FIG. 1) to implement an artificial neural network or neuromorphic computing system, etc. The resistive memory device 320 is configured to have a tunable conductance state (or tunable resistance state) which can be programmatically adjusted within a range of a plurality of different conductance levels to tune the weight of the non-volatile analog resistive memory cell 300.

Figure 4:
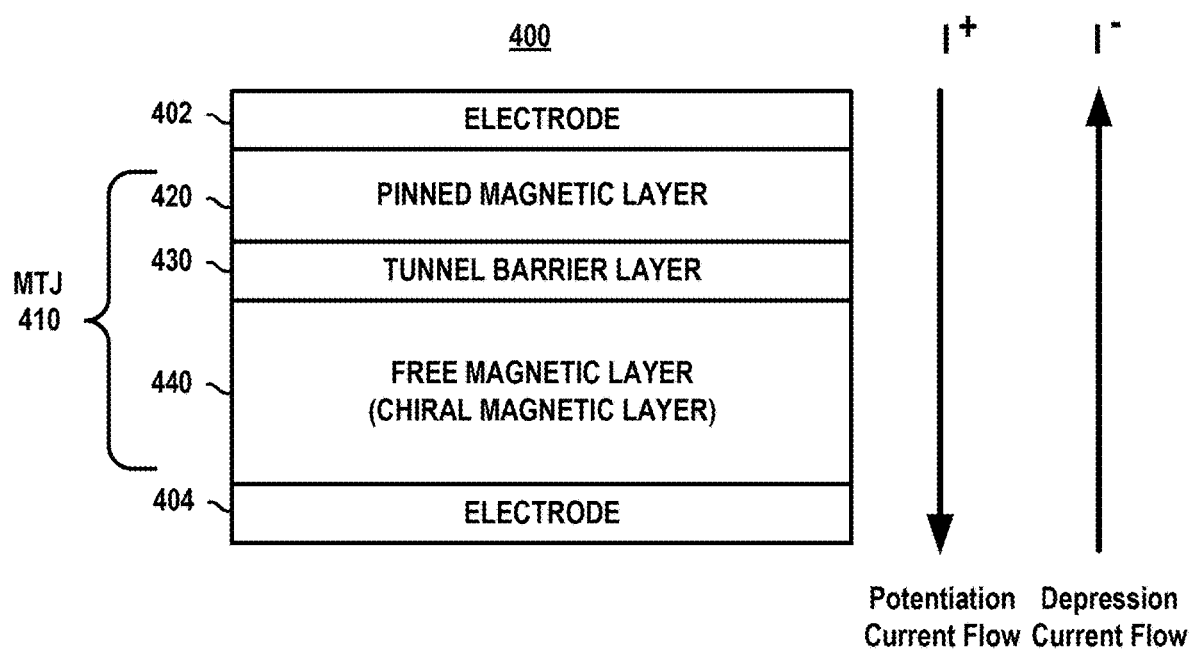
FIG. 4 schematically illustrates a magnetic skyrmion resistive memory device, according to an exemplary embodiment of the disclosure.

FIG. 4 schematically illustrates a magnetic skyrmion resistive memory device 400, according to an exemplary embodiment of the disclosure. In some embodiments, FIG. 4 illustrates an exemplary embodiment of the resistive memory device 320 which can be implemented in the non-volatile analog resistive memory cell 300 of FIG. 3. As schematically illustrated in FIG. 4, the magnetic skyrmion resistive memory device 400 comprises a first electrode 402, a second electrode 404, and a magnetic tunnel junction (MTJ) structure 410 disposed between the first and second electrodes 402 and 404. The MTJ structure 410 comprises a pinned magnetic layer 420, a tunnel barrier layer 430, and a free magnetic layer 440.

In accordance with exemplary embodiments of the disclosure, the free magnetic layer 400 comprises at least one magnetic layer which comprises a magnetic material that is capable of hosting topological spin textures, such as skyrmions, which are stable at room temperature and operating temperatures of the resistive memory devices. In this context, a topological spin texture-hosting magnetic layer (e.g., skyrmion-hosting magnetic layer) is a magnetic layer having a magnetic material which enables the realization (e.g., generation, existence, presence, etc.) of stable topological spin textures (e.g., magnetic skyrmions) in the magnetic layer due to, e.g., the crystal structure and magnetic characteristics of the magnetic material which allows the formation of stable topological spin textures.

More specifically, as is known in the art, magnetic moments (spins) in magnetic materials can form various structures known as spin textures. In typical magnetic materials, the spins of neighboring atoms tend to align parallel or antiparallel to each other, resulting in ferromagnets or antiferromagnets, respectively. However, in some magnetic materials such as chiral magnetic materials, there are certain types of physical interactions between spins due to a particular crystalline or multilayer structure, wherein the spins align in a topological spin texture. A magnetic skyrmion is a common type of topological spin texture (topologically stable spin texture) which comprises a non-collinear configuration of magnetic moments with a small, swirling magnetic structure, in which the constituent spins point to all directions wrapping a unit sphere i.e., the spin pattern of a magnetic skyrmion is pattern that can be projected onto a sphere and which wraps the entire surface of sphere. The topology of a magnetic skyrmion arises from competing magnetic interactions between a traditional Heisenberg direct-exchange interaction (e.g., ferromagnetic exchange interaction), and an antisymmetric exchange interaction referred to as the Dzyaloshinskii-Moriya (DM) interaction (or DMI), wherein these competing interactions cause magnetic moments in the spin structure to orient at 90° relative to each other.

In a magnetic skyrmion, the orientation of spins rotates progressively from an up direction at the edge of the spin texture to a down direction at the center of the spin texture, or vice versa. More specifically, in a magnetic skyrmion, a magnetization curls in the inside of the spin structure, and culminates along an out-of-plane direction in the core and periphery of the spin structure, wherein a spin direction in a core region of the magnetic skyrmion is opposite to the spin direction in a peripheral region of the magnetic skyrmion. Skyrmions stabilized by DMI are commonly referred to as Bloch-type skyrmions or Neel-type skyrmions The properties of a magnetic skyrmion can be characterized by helicity, polarity, and topological charge. In particular, helicity is defined as an angle of global rotation around a z-axis of the magnetic skyrmion. For a Neel-type skyrmion, helicity is deemed to be zero. The polarity property defines a magnetization direction at the core of the magnetic skyrmion, e.g., whether the magnetization points in the positive (p=1) or negative (p=−1) z-direction at the core of the magnetic skyrmion. The topological charge describes how many times magnetic moments of the spin texture wrap around a unit sphere in the mapping, wherein topological charge can be −1 or +1. For Bloch-type and Neel-type skyrmion configurations, the topological charge and polarity are equal (Q=p), while the difference in helicity distinguishes the Bloch-type and Neel-type skyrmion configurations from one another. On the other hand, magnetic textures stabilized by the DM interaction can also have opposite topological charge and polarity (Q=−p), such as antiskyrmions.

In some embodiments, the free magnetic layer 440 comprises a chiral magnetic layer that can host stable topological spin textures such as magnetic skyrmions. A chiral magnetic material comprises a magnetic material where a non-collinear magnetic moment arrangement with fixed chirality (handedness) can be stabilized by a physical antisymmetric exchange interaction (DM interaction). By way of specific example, magnetic skyrmions can be generated and hosted in chiral magnetic materials that exhibit spiral magnetism due to DM interaction. As noted above, magnetic skyrmions are topological spin textures that occur in a magnetization field. The magnetic skyrmions can exist in different configurations referred to as spiral (Bloch-type) configurations, or hedgehog (Neel-type) configurations, which are stabilized by DM interaction. Magnetic skyrmions are topological in nature, are small in size (e.g., from 1 nm to 300 nm), and exhibit low energy consumption, which makes magnetic skyrmions promising candidates for highly energy-efficient data-storage, processing, and transmission devices, and other spintronics devices.

The MTJ structure 410 comprises a magnetoresistive memory element in which a spin-transfer torque (STT) phenomenon is utilized to change the magnetoresistive state of the MTJ structure 410 using spin currents. The STT MTJ structure 410 utilizes tunneling magnetoresistance (TMR) to store information. The basic structure of the MTJ structure 410 includes two thin magnetic layers separated by a thin insulating layer through which electrons can tunnel. The STT phenomenon is realized in the MTJ structure 410 where the free magnetic layer 440 has a non-fixed magnetization, and the pinned magnetic layer 420 (or reference layer) has a fixed magnetization. The MTJ structure 410 stores information by switching the magnetization state of the free magnetic layer 440. When the magnetization direction of the free magnetic layer 440 is parallel to the magnetization direction of the pinned magnetic layer 420 (referred to as parallel (P) state), the MTJ structure 410 is in a "low resistance" state. Conversely, when the magnetization direction of the free magnetic layer 440 is antiparallel to the magnetization direction of the pinned magnetic layer 420 (referred to as antiparallel (AP) state), the MTJ structure 410 is in a "high resistance" state. The tunneling current is typically higher when the magnetic moments of the two magnetic layers 420 and 440 are parallel, and lower when the magnetic moments of the two magnetic layers 420 and 440 are anti-parallel.

The spin-transfer torque phenomenon has the effect of modifying the magnetic orientation of the free magnetic layer 440 using spin-polarized current. As is known in the art, charge carriers (such as electrons) have a property known as "spin" which is a small quantity of angular momentum that is intrinsic to the carrier. While an electric current is generally unpolarized (comprising 50% spin-up and 50% spin-down electrons), a spin-polarized current has a greater number of spin-up electrons or spin-down electrons. A spin-polarized current can be generated by passing a current through the pinned magnetic layer 420. The spin-polarized current has the effect of changing the magnetic orientation of the free magnetic layer 440.

In accordance with exemplary embodiments of the disclosure, the spin-polarized current flow through the free magnetic layer 440 comprising a chiral magnetic layer excites the generation or annihilation of magnetic skyrmions in the chiral magnetic layer. In a conventional STT-MTJ device, due to a strong magnetic anisotropy of the free magnetic layer, the current-induced switching of the free magnetic layer produces two stable magnetization states (AP or P). However, by utilizing a layer of chiral magnetic material in the free magnetic layer 440, the spin-polarized spin currents can be utilized to induce multiple skyrmion states in the free magnetic layer 440, and thereby tune the magnetoresistance of the MTJ structure 410 in manner that enables the magnetic skyrmion resistive memory device 400 to be effectively utilized as a resistive memory element for neuromorphic computing.

The various layers and structures of the magnetic skyrmion resistive memory device 400 can be formed of materials that are suitable for a given application. For example, in some embodiments, the first and second electrodes 402 and 404 are formed of suitable conductive material(s) such as tantalum, tantalum nitride, ruthenium, titanium, etc. Furthermore, in some embodiments, the pinned magnetic layer 420 comprises a layer of magnetic material such as cobalt (Co) or iron (Fe), boron (B), or any combination thereof. For example, the pinned magnetic layer 420 can be formed of CoFeB or CoFe. In some embodiments, the tunnel barrier layer 420 is formed of a non-magnetic, insulating material such as magnesium oxide (MgO), aluminum oxide (AlO), or titanium oxide (TiO) or any other suitable materials.

The free magnetic layer 440 can be a multilayer structure or a single layer structure. For example, the free magnetic layer 400 can be multilayer structure which comprises a first heavy metal layer, a second heavy metal layer, and a chiral magnetic layer disposed between the first and second heavy metal layers. In some embodiments, the first and second heavy metal layers have an opposite DMI and work in concert to enhance the overall DMI of the MTJ structure. In other embodiments, the free magnetic layer 440 includes a single chiral magnetic layer, e.g., a single non-centrosymmetric magnetic layer, which has a relatively strong DMI, such as FeCoSi, FeGe etc. As is known in the art, a non-centrosymmetric magnetic layer comprises a magnetic material in which the crystal structure of the magnetic material lacks an inversion center. The free magnetic layer 440 can formed of any suitable non-centrosymmetric magnetic layer in which magnetic skyrmions can naturally form. Other exemplary embodiments for implementing magnetic skyrmion resistive memory devices with free magnetic layers comprising multilayer structures or single layer structures with chiral magnetic layers will be discussed in further detail below in conjunction with FIGS. 6, 7, 8 and 9.

It is to be understood that the FIG. 4 illustrates an exemplary embodiment of a multi-state resistive memory device which implements a free magnetic layer that is configured to host topological spin textures, such as magnetic skyrmions, wherein the state of the resistive memory device is modulated using programming current to generate or annihilate topological spin textures that exist in the free magnetic layer 440. While skyrmion-based resistive memory devices are described herein for illustrative purposes, it is to be understood that the free magnetic layer 440 can be implemented using any suitable magnetic material that is configurable to host one of various types of stable topological spin textures, which are suitable for modulating a magnetoresistance of the MTJ structure 410 of the resistive memory device 400.

FIG. 4 schematically illustrates bidirectional charge currents, $I^+$ and $I^-$, which can be generated to flow through the magnetic skyrmion resistive memory device 400 to (i) generate magnetic skyrmions in the free magnetic layer 440 during a potentiation programming operation (to increase the resistance of the resistive memory device 400 to a target resistive state) and to (ii) annihilate magnetic skyrmions existing in the free magnetic layer 440 during a depression programming operation (to decrease the resistance of the resistive memory device 400 to a target resistive state). In some embodiments, assuming the magnetic skyrmion resistive memory device 400 is implemented in the memory cell 300 of FIG. 3, the first (upper) electrode 402 would be coupled to the bit line BL, and the second (bottom) electrode 404 would be coupled to the drain D terminal of the access transistor 310.

In such configuration, an exemplary potentiation programming operation could be performed by, e.g., (i) applying a ground (GND) voltage level (e.g., 0V) to the source line SL, (ii) applying a positive voltage level to the word line WL which is sufficient to keep the access transistor 310 activated (in saturation mode) during the potentiation programming operation, and (iii) applying a sequence of one or more positive voltage pulses to the bit line BL to thereby generate a sequence of charging current pulses which generate positive current flow $I^+$ from the first electrode 402 to the second electrode 404 through the resistive memory device 400. As noted above, in some exemplary configurations, the positive current flow $I^+$ from the pinned magnetic layer 420 to the free magnetic layer 440 generates a spin current which causes magnetic skyrmions to be generated in the free magnetic layer 440.

On the other hand, an exemplary depression programming operation could be performed by, e.g., (i) applying a ground (GND) voltage level (e.g., 0V) to the bit line BL, (ii) applying a positive voltage level to the word line WL which is sufficient to keep the access transistor 310 activated (in saturation mode) during the depression programming operation, and (iii) applying a sequence of one or more positive voltage pulses to the source line SL to thereby generate a sequence of charging current pulses which generate negative current flow $I^-$ from the second electrode 404 to the first electrode 402 through the resistive memory device 400. As noted above, in some exemplary configurations, the negative current flow $I^-$ from the free magnetic layer 440 to the pinned magnetic layer 420 causes the annihilation of magnetic skyrmions in the free magnetic layer 440.

To read a state of the magnetic skyrmion resistive memory device 400, a read operation can be performed by grounding the source line SL, applying a positive voltage level to the word line WL to activate the access transistor 310, and applying a read voltage signal on the bit line BL. The read voltage signal has a magnitude and duration (pulse width) which is sufficient to generate a read current on the bit line BL, wherein the magnitude of the read current corresponds to, and is used to determine, the conductance state of the magnetic skyrmion resistive memory device 400 (or more specifically, the magnetoresistive state of the MTJ structure 410). The magnitude of the read current is sufficiently small to read the conductance state of the magnetic skyrmion resistive memory device 400, without causing a change in the conductance state of the magnetic skyrmion resistive memory device 400.

FIG. 5A schematically illustrates potentiation and depression programming operations for generating and annihilating magnetic skyrmions in a magnetic skyrmion resistive memory device, according to an exemplary embodiment of the disclosure. More specifically, FIG. 5A schematically illustrates a progressive switching of magnetic polarization states of the exemplary MTJ structure 410 of the resistive memory device 400 of FIG. 4 during potentiation and depression programming operations using sequences of identical programming pulses. FIG. 5A schematically illustrates different magnetic polarization states 500-1, 500-2, and 500-3 of the MTJ structure 410 based on a number of magnetic skyrmions that exist in the free magnetic layer 440.

For example, FIG. 5A schematically illustrates an initial magnetic polarization state 500-1 of the MTJ structure 410 in which the pinned magnetic layer 420 and the free magnetic layer 440 have a perpendicular magnetic anisotropy (PMA) in which magnetic polarization vectors 422 of the pinned magnetic layer 420, and magnetic polarization vectors 442 of the free magnetic layer 440 are oriented in a direction that is perpendicular to the planes of the pinned and free magnetic layers 420 and 440. The initial magnetic polarization state 500-1 of the MTJ structure 410 is schematically illustrated as a parallel (P) state (low resistance state) in which the magnetic polarization vectors 442 of the free magnetic layer 440 are oriented in the same direction as the magnetic polarization vectors 422 of the pinned magnetic layer 420.

Further, FIG. 5A schematically illustrates additional magnetic polarization states 500-2 and 500-3 of the MTJ structure 410 which are achieved by changing a number of magnetic skyrmions 505 that exist in the free magnetic layer 440 as a result of performing potentiation or depression programming operations to generate or annihilate magnetic skyrmions in the free magnetic layer 440. For illustrative purposes, the magnetic polarization state 500-2 of the MTJ structure 410 is schematically illustrated to be a magnetic polarization state in which the free magnetic layer 440 has one magnetic skyrmion 505, and the magnetic polarization state 500-3 of the MTJ structure 410 is schematically illustrated to be a magnetic polarization state in which the free magnetic layer 440 has two magnetic skyrmions 505. While not specifically shown in FIG. 5A, additional magnetic polarization states of the MTJ structure 410 can be generated by increasing the number of magnetic skyrmions 505 (e.g., 3 or more) in the free magnetic layer 440.

As compared to the initial magnetic polarization state 500-1, the magnetic polarization state 500-2 of the MTJ structure 410 has a greater magnetoresistance as a result of the presence of at least one magnetic skyrmions 505 in the free magnetic layer 440. Similarly, as compared to the magnetic polarization state 500-2, the magnetic polarization state 500-3 of the MTJ structure 410 has a greater magnetoresistance as a result of the presence of at least two magnetic skyrmions 505 in the free magnetic layer 440. As noted above, increasing the number of magnetic skyrmions 505 in the free magnetic layer 440 serves to increase the magnetoresistance of the MTJ structure 410, thereby allowing the MTJ structure 410 to be programmed to have multiple resistance/conductance states to implement a multi-level resistive memory device FIG. 5A schematically illustrates a potentiation programming operation that is performed by applying potentiation programming pulses 510 to induce the formation magnetic skyrmions 505 in the free magnetic layer 440 a result of current flow in a first direction through the MTJ structure 410. In particular, FIG. 5A illustrates a sequence of identical potentiation pulses having a same amplitude $+V_{PP}$ and pulse width W, which as discussed above, can be applied to the bit line BL (FIG. 3) with the source line SL grounded, to thereby generate a sequence of charging current pulses which generate a positive current flow $I^+$ from the first electrode 402 to the second electrode 404 through the resistive memory device 400.

For illustrative purposes, FIG. 5A illustrates an exemplary potentiation programming operation in which the number of skyrmions 505 generated in the free magnetic layer 440 increases with an increasing number of potentiation programming pulses (i.e., increasing pulse count (PC)). In particular, as depicted in FIG. 5A, the magnetic polarization state 500-2 of the MTJ structure 410 is achieved (starting from the initial magnetic polarization state 500-1) after applying two programming pulses (e.g., PC=2) to cause the generation of at least one magnetic skyrmion 505 in the free magnetic layer 440. Further, the magnetic polarization state 500-3 of the MTJ structure 410 is achieved (starting from the magnetic polarization state 500-2) after applying two additional potentiation programming pulses (e.g., PC=4) to increase the number of magnetic skyrmions 505 in the free magnetic layer 440. While not specifically shown in FIG. 5A, additional magnetic polarization states of the MTJ structure 410 can be generated by increasing the number of magnetic skyrmions 505 (e.g., 3 or more) in the free magnetic layer 440 to thereby increase the magnetoresistance of the resistive memory device 400. Ultimately, after applying a sufficient number of potentiation pulses, an AP state can be achieved in which a large number of magnetic skyrmions 505 in the free magnetic layer 505 are forced to combine, resulting in the AP state in which the magnetic polarization vectors of the free magnetic layer 440 are oriented in a direction which is opposite to the direction of the magnetic polarization vectors 422 of the pinned magnetic layer 420.

In addition, FIG. 5A schematically illustrates a depression programming operation that is performed by applying depression programming pulses 520 to cause annihilation of magnetic skyrmions 505 in the free magnetic layer 440 a result of current flow in a second direction through the MTJ structure 410 (which is opposite the first direction of current flow that results in the formation of magnetic skyrmions). In particular, FIG. 5A illustrates a sequence of identical depression pulses having a same amplitude $+V_{DP}$ and pulse width W, which as discussed above, can be applied to the source line SL (FIG. 3) with the bit line BL grounded, to thereby generate a sequence of charging current pulses which generate negative current flow $I^-$ from the second electrode 404 to the first electrode 402 through the resistive memory device 400, which causes the annihilation of magnetic skyrmions in the free magnetic layer 440.

For illustrative purposes, FIG. 5A illustrates an exemplary depression programming operation in which the number of skyrmions 505 that are annihilated from the free magnetic layer 440 increases with an increasing number of depression programming pulses (i.e., increasing pulse count (PC)). In particular, as depicted in FIG. 5A, the magnetic polarization state 500-3 of the MTJ structure 410 is achieved (starting from another magnetic polarization state of the MTJ structure 410 with a higher magnetoresistance, not shown) after applying a given number n of depression programming pulses (e.g., PC=n) to cause the annihilation of one or more magnetic skyrmions 505 in the free magnetic layer 440, resulting in the magnetic polarization state 500-3 in which the free magnetic layer 440 comprise two magnetic skyrmions 505. Further, the magnetic polarization state 500-2 of the MTJ structure 410 is achieved (starting from the magnetic polarization state 500-3) after applying two additional depression programming pulses (e.g., PC=n+2) to annihilate and decrease the number of magnetic skyrmions 505 in the free magnetic layer, resulting in the magnetic polarization state 500-2 in which the free magnetic layer 440 comprises one magnetic skyrmion 505. Additional depression programming pulses can be applied to achieve the initial magnetic polarization state 500-1.

FIG. 5A illustrates exemplary potentiation/depression programming schemes using identical programming pulses to achieve linear bi-directional conductance tuning of a magnetic skyrmions resistive memory device. For example, FIG. 5A illustrates a linear potentiation programming scheme in which a number of skyrmions that are generated per increasing pulse count is linear, e.g., one (1) skyrmion is generated per two (2) potentiation pulses, as well as a linear depression programming scheme in which a number of skyrmions that are annihilated per increasing pulse count is linear, e.g., one (1) skyrmion is annihilated per two (2) depression pulses. It is to be understood that the potentiation and depression programming operations as presented in FIG. 5A are merely exemplary illustrations of principles of programming operations for tuning the resistive states of a magnetic skyrmions resistive memory device, and that linearity in the conductance tuning of such resistive memory devices will vary depending on various factors which include, but are not limited to, the magnitude and pulse widths of the potentiation and depression programming pulses, the structural and electrical characteristics of various components of the magnetic skyrmion resistive memory device, the dynamic range (e.g., number) of conductance states of the magnetic skyrmion resistive memory device, etc. In this regard, it is to be understood that the magnitude and pulse widths of the potentiation and depression programming pulses can be optimized to achieve desired conductance tuning behaviors as needed for a given application.

Figure 5B:
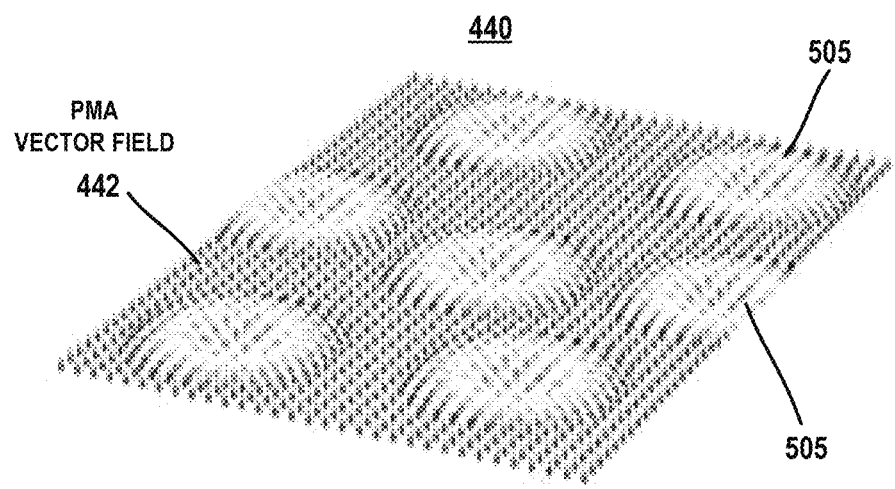
FIGS. 5B and 5C schematically illustrate magnetic skyrmions that are generated in a layer of magnetic material having a perpendicular magnetic anisotropy, according to an exemplary embodiment of the disclosure.
Figure 5C:
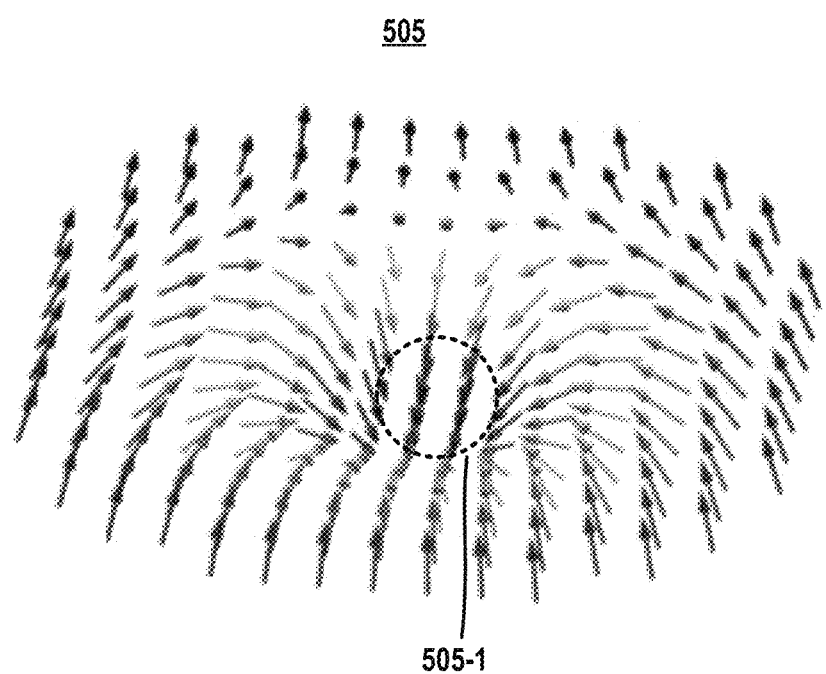

While FIG. 5A generically illustrates the magnetic skyrmions 505 as arrows with a magnetic polarization pointing in a direction opposite to the PMA polarization 442 of the magnetic free layer 440, the magnetic skyrmions 505 that are formed in the free magnetic layer 440 can have a topological structure and distribution as illustrated in FIGS. 5B and 5C. In particular, FIGS. 5B and 5C illustrate an exemplary structure of magnetic skyrmions that are generated in a layer of magnetic material having a perpendicular magnetic anisotropy, according to an exemplary embodiment of the disclosure. FIG. 5B illustrates a plurality of magnetic skyrmions 505 that are formed in the free magnetic layer 440 having a PMA magnetic polarization. The magnetic skyrmions 505 are schematically illustrated as topological spin textures that formed in various regions of a PMA vector field 442 of the free magnetic layer 440. The magnetic skyrmions 505 have repulsive magnetic forces which keep the magnetic skyrmions 505 separated as they are formed and dynamically migrate over regions of the free magnetic layer 440 during programming operations.

Moreover, FIG. 5C illustrates an exemplary texture of the magnetic skyrmions 505 having a Neel-type configuration (or hedgehog configuration) in the PMA magnetic layer 440. As shown in FIG. 5C, a core region 505-1 of the magnetic skyrmion 505 comprises magnetic polarization vectors which are orientated in a direction that opposite (i.e., antiparallel) to the direction of the magnetic polarization vectors at the perimeter of the magnetic skyrmion 505 and in the surrounding PMA field 442 of the free magnetic layer 440 (FIG. 5B). More specifically, as schematically illustrated in FIG. 5C, the orientation of spins rotates progressively from an up direction (e.g., positive z-direction) at the periphery of the magnetic skyrmion 505 to a down direction (e.g., negative z-direction) at the core 505-1 of the magnetic skyrmion 505. In the exemplary embodiment, the magnetic skyrmion has a negative polarity (p=−1) (core spin points in negative z-direction) and a topological charge of Q=−1.

It is to be understood that FIGS. 5B and 5C illustrates an exemplary topological spin texture having a particular magnetic skyrmion configuration in magnetic layer having a PMA. However, it is to be understood that resistive memory devices according to other embodiments of the disclosure can be implemented using other suitable types of topological spin textures, such as biskyrmions, antiskyrmions, merons, spiral spin textures, helical spin textures, conical spin textures, and other types of stable topological spin textures which can be hosted in free magnetic layers having a PMA configuration or in-plane magnetic configuration, and which can be generated/annihilated using, e.g., STT techniques.

Figure 6:
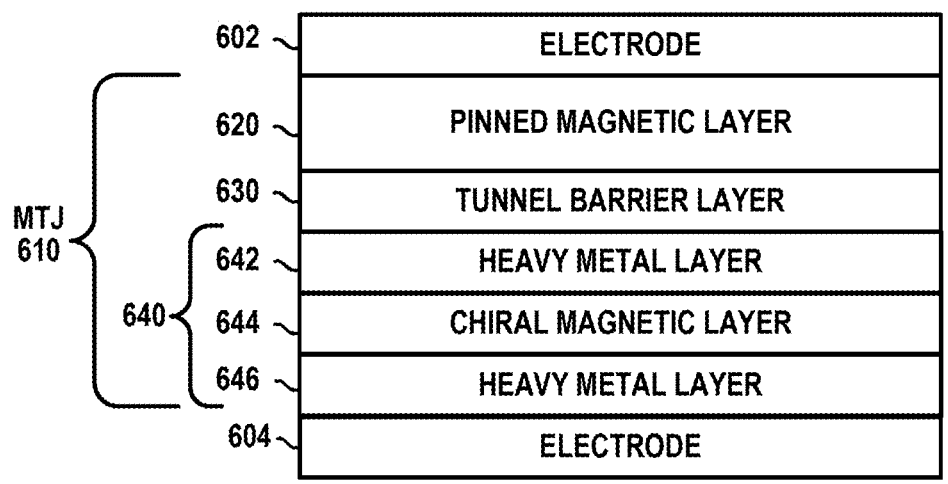
FIG. 6 schematically illustrates a magnetic skyrmion resistive memory device, according to another exemplary embodiment of the disclosure.

FIG. 6 schematically illustrates a magnetic skyrmion resistive memory device, according to another exemplary embodiment of the disclosure. In particular, FIG. 6 schematically illustrates a magnetic skyrmion resistive memory device 600 which comprises a first electrode 602, a second electrode 604, and an MTJ structure 610 disposed between the first and second electrodes 602 and 604. The MTJ structure 610 comprises a pinned magnetic layer 620, a tunnel barrier layer 630, and a free magnetic layer 640. The free magnetic layer 640 is a multilayer structure which comprise a first heavy metal layer 642, a chiral magnetic layer 644, and a second heavy metal layer 646. In some embodiments, the first and second heavy metal layers have an opposite DMI and work in concert to enhance the overall DMI of the free magnetic layer 640 of the MTJ structure 610.

In some embodiments, the first electrode 602, the second electrode 604, the pinned magnetic layer 620, and the tunnel barrier layer 630 are formed of the same or similar materials as the corresponding elements of the resistive memory device 400 (FIG. 4), as discussed above. In some embodiments, the first heavy metal layer 642 comprises platinum, the chiral magnetic layer 644 comprises a cobalt-iron-boron alloy, and the second heavy metal layer 646 comprises tantalum. In some embodiments, the first heavy metal layer 642 comprises platinum, the chiral magnetic layer 644 comprises a cobalt-iron-boron alloy, and the second heavy metal layer 646 comprises iridium. In some embodiments, the first heavy metal layer 642 comprises platinum, the chiral magnetic layer 644 comprises iron, and the second heavy metal layer 646 comprises iridium.

Figure 7:
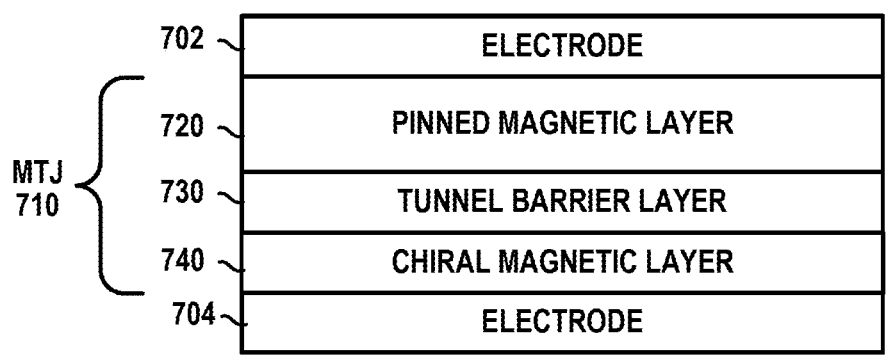
FIG. 7 schematically illustrates a magnetic skyrmion resistive memory device, according to another exemplary embodiment of the disclosure.

FIG. 7 schematically illustrates a magnetic skyrmion resistive memory device, according to another exemplary embodiment of the disclosure. In particular, FIG. 7 schematically illustrates a magnetic skyrmion resistive memory device 700 which comprises a first electrode 702, a second electrode 704, and an MTJ structure 710 disposed between the first and second electrodes 702 and 704. The MTJ structure 710 comprises a pinned magnetic layer 720, a tunnel barrier layer 730, and a free magnetic layer 740 which comprise a single chiral magnetic layer. In some embodiments, the free magnetic layer 740 comprises a single non-centrosymmetric chiral magnetic layer having a sufficiently strong DMI which enables the formation of stable magnetic skyrmions without the need for additional layers (e.g., heaving metal layers). In some embodiments, the single non-centrosymmetric chiral magnetic layer comprises a cobalt-iron-silicon alloy, or an iron-germanium alloy, etc.

Figure 8:
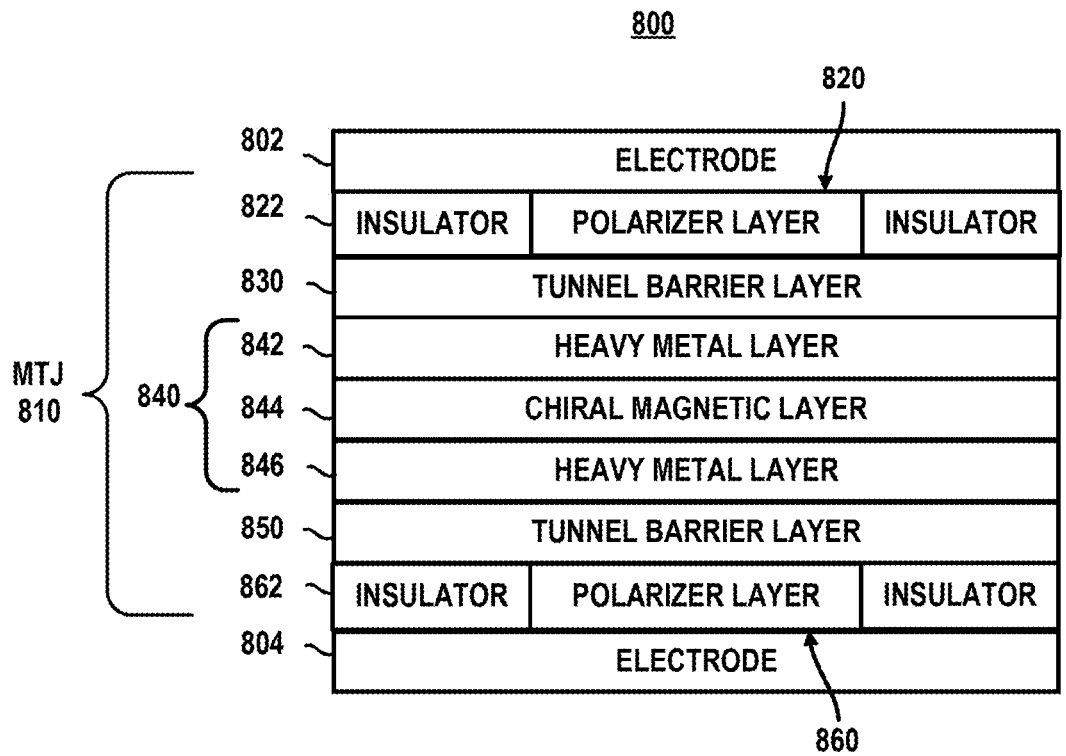
FIG. 8 schematically illustrates a magnetic skyrmion resistive memory device, according to another exemplary embodiment of the disclosure.

FIG. 8 schematically illustrates a magnetic skyrmion resistive memory device, according to another exemplary embodiment of the disclosure. In particular, FIG. 8 schematically illustrates a magnetic skyrmion resistive memory device 800 which comprises a first electrode 802, a second electrode 804, and an MTJ structure 810 disposed between the first and second electrodes 802 and 804. The MTJ structure 810 comprises a first polarizer layer 820 (e.g., a first pinned magnetic layer), a first insulator layer 822 (e.g., silicon oxide layer), a first tunnel barrier layer 830, a free magnetic layer 840, a second tunnel barrier layer 850, a second polarizer layer 860 (e.g., a second pinned magnetic layer), and a second insulator layer 862. The free magnetic layer 840 is a multilayer structure which comprise a first heavy metal layer 842, a chiral magnetic layer 844, and a second heavy metal layer 846. As noted above, in some embodiments, the first and second heavy metal layers 842 and 846 have an opposite DMI and work in concert to enhance the overall DMI of the free magnetic layer 840 of the MTJ structure 810.

The exemplary skyrmion resistive memory device 800 comprises the free magnetic layer 840 disposed between two pinned magnetic layers (e.g., the first and second polarizer layers 820 and 860). The first and second polarizer layers 820 and 860 serve to enhance potentiation and depression programing by generating spin-polarized currents to modulate the magnetic polarization of the chiral magnetic layer 844 and induce the formation or annihilation of magnetic skyrmions in the chiral magnetic layer 844. For example, during a potentiation programming operation, when programming current flows through the resistive memory device 800 from the first electrode 802 to the second electrode 804, the first polarizer layer 820 serves to generate a spin-polarized current which induces the formation of magnetic skyrmions in the chiral magnetic layer 844. On the other hand, during a depression programming operation, when programming current flows through the resistive memory device 800 from the second electrode 804 to the first electrode 802, the second polarizer layer 860 serves to generate a spin-polarized current which induces the annihilation of magnetic skyrmions in the chiral magnetic layer 844.

In some embodiments, as shown in FIG. 8, the first polarizer layer 820 and the second polarizer layer 860 each comprise a footprint area which is smaller than the footprint area of the other layers of the MTJ structure 810. The smaller lateral size (footprints) of the first and second polarizer layers 820 and 860 serves to locally increase a current density near a central region of the MTJ structure 810 which is aligned to the area of the polarizer layers 820 and 860. The increased current density above a skyrmion-generation threshold current will generate magnetic skyrmions locally in the central region of the chiral magnetic layer 844 of the MTJ structure 810. Since magnetic skyrmions have repulsive forces between them, during a potentiation programming operation, existing magnetic skyrmions near and in the central region of the chiral magnetic layer 844 will be repelled to the peripheral regions of the chiral magnetic layer 844 as other magnetic skyrmions are generated in the central region of the chiral magnetic layer 844 by successive potentiation programming pulses.

Similarly, during depression programming operations, the increased current density above a skyrmion-annihilation threshold current will annihilate magnetic skyrmions locally in the central region of the chiral magnetic layer 844 of the MTJ structure 810. Since magnetic skyrmions have repulsive forces between them, during a depression programming operation, as existing magnetic skyrmions near and in the central region of the chiral magnetic layer 844 are annihilated, magnetic skyrmions in the peripheral region of the chiral magnetic layer 844 may be repelled to the central region of the chiral magnetic layer 844 and annihilated by successive depression programming pulses. This structural configuration helps to provide better control on the number of magnetic skyrmions that are generated or annihilated during programming operations, while also improving the current-density for programming using a given amount of absolute current.

Figure 9:
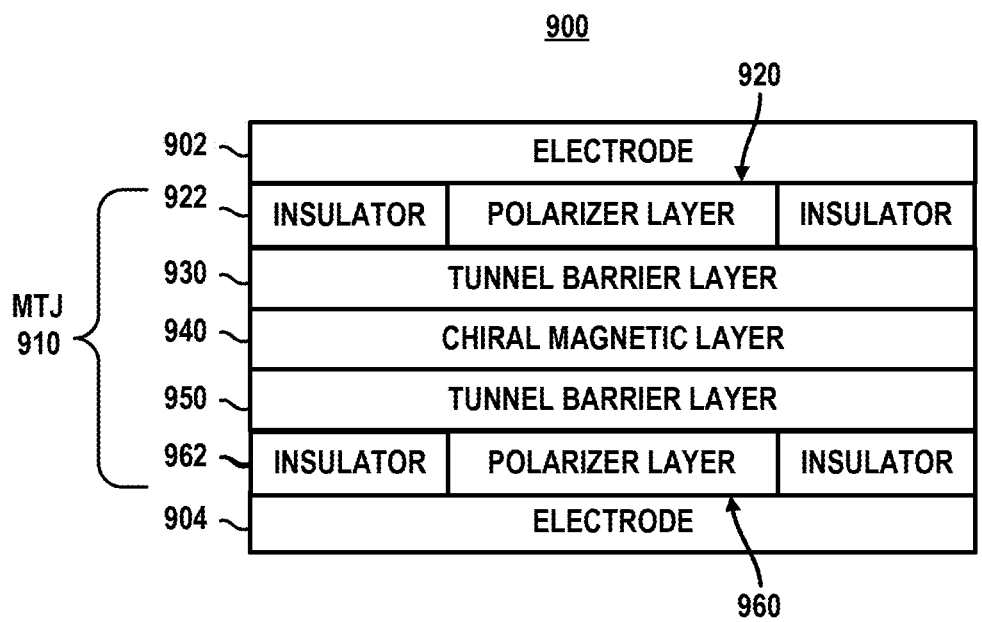
FIG. 9 schematically illustrates a magnetic skyrmion resistive memory device, according to another exemplary embodiment of the disclosure.

FIG. 9 schematically illustrates a magnetic skyrmion resistive memory device, according to another exemplary embodiment of the disclosure. In particular, FIG. 9 schematically illustrates a magnetic skyrmion resistive memory device 900 which comprises a first electrode 902, a second electrode 904, and an MTJ structure 910 disposed between the first and second electrodes 902 and 904. The MTJ structure 910 comprises a first polarizer layer 920 (e.g., a first pinned layer), a first insulator layer 922 (e.g., silicon oxide layer), a first tunnel barrier layer 930, a free magnetic layer 940, a second tunnel barrier layer 950, a second polarizer layer 960 (e.g., a second pinned layer), and a second insulator layer 962. The free magnetic layer 940 comprises a single non-centrosymmetric chiral magnetic layer having a sufficiently strong DMI which enables the formation of stable magnetic skyrmions without the need for additional layers (e.g., heavy metal layers). In some embodiments, as noted above, the single non-centrosymmetric chiral magnetic layer 940 comprises a cobalt-iron-silicon alloy, or an iron-germanium alloy, etc.

FIG. 9 illustrates an exemplary embodiment of a magnetic skyrmion resistive memory device 900 which comprises the single chiral magnetic layer 940 disposed between pinned magnetic layers (e.g., the first and second polarizer layers 920 and 960). As in the exemplary embodiment of FIG. 8, the first and second polarizer layers 920 and 960 serve to enhance potentiation and depression programing by generating spin-polarized currents to modulate the magnetic polarization of the chiral magnetic layer 940 and induce the formation or annihilation of magnetic skyrmions in the chiral magnetic layer 940. Furthermore, similar to the exemplary embodiment of FIG. 8, the smaller footprint polarizer layers 920 and 960 serve to locally increase a current density near a central region of the MTJ structure 910 which is aligned to the area of the first and second polarizer layers 820 and 860, to thereby enhance the generation and annihilation of magnetic skyrmions in and near the central region of the chiral magnetic layer 940 of the MTJ structure 910.

It is to be appreciated that the exemplary resistive memory devices as discussed herein (e.g., skyrmion-based resistive memory devices) can be readily implemented as storage elements in an RPU array of non-volatile resistive memory cells of an RPU system to enable bidirectional linear tuning of conductance states (e.g., synaptic weights) in the RPU array. The bidirectional linear tuning characteristics of a skyrmion-based resistive memory device allow for the implementation of RPU memory cells having a 1T-1R architecture, such as shown in FIG. 3. An RPU system which implements, e.g., skyrmion-based resistive memory devices as discussed herein can be utilized to support various types of neuromorphic computing applications (e.g., machine learning applications, image classification applications, neural network training applications, artificial intelligence applications, etc.), or otherwise provide support for hardware accelerated computing in conjunction with a digital processing system (von Neumann architecture-based processors) which utilizes an RPU system to perform in-memory computations such as matrix-vector operations, vector-vector multiplication operations, data or image classification operations, or other types of in-memory operations which require multiply-accumulate (MAC) operations that can be performed in the analog domain through hardware accelerated computing using the RPU system. In such instances, a computing system can be implemented by integrating digital processing cores and a neuromorphic computing system (e.g., RPU system).

In this regard, exemplary embodiments of the disclosure may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 10:
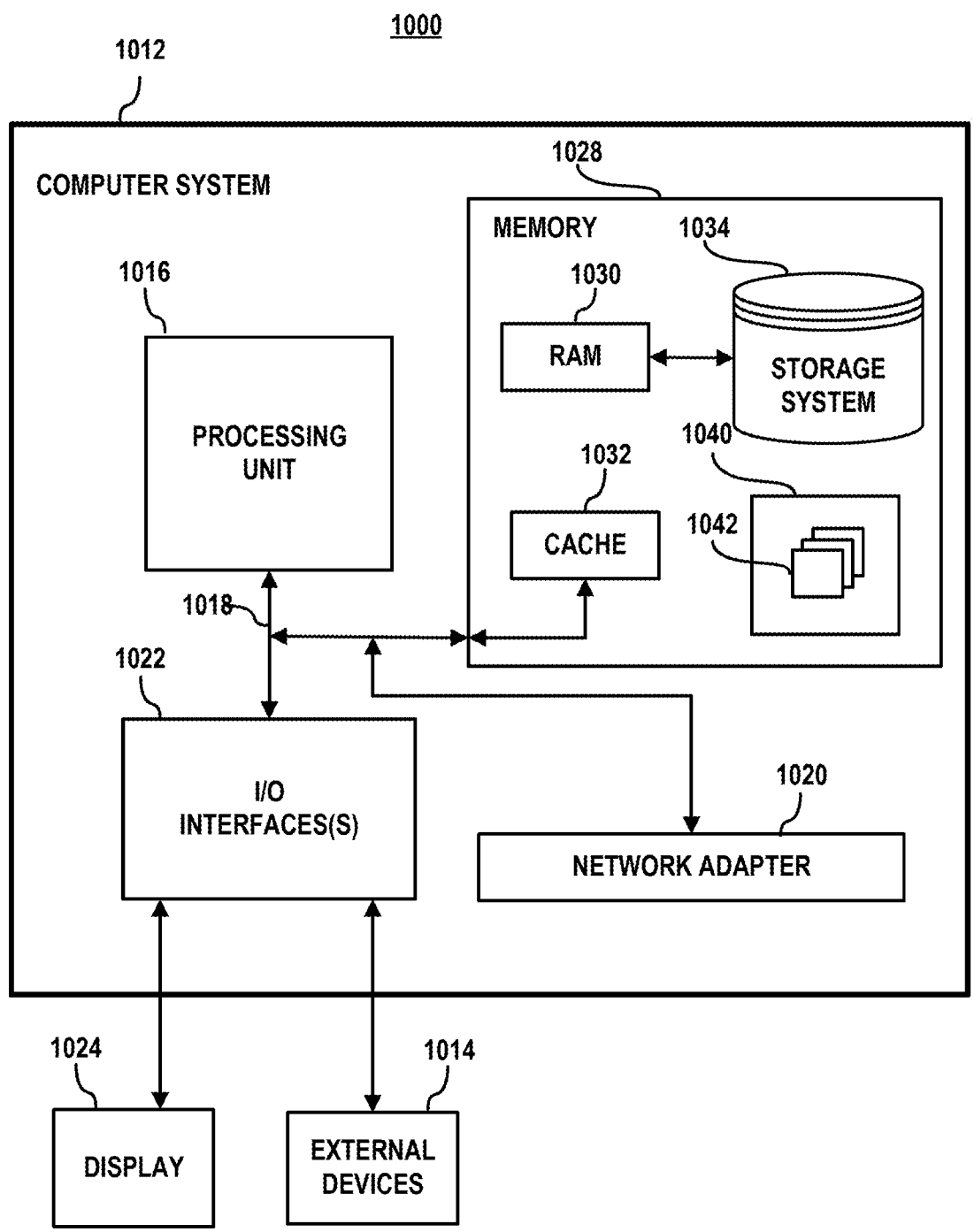
FIG. 10 schematically illustrates an exemplary architecture of a computing node that can host a system which is configured to execute a neuromorphic computing application utilizing an RPU system for hardware accelerated computing, according to an exemplary embodiment of the disclosure.

These concepts are illustrated with reference to FIG. 10, which schematically illustrates an exemplary architecture of a computing node that can host a system which is configured to execute a neuromorphic computing application utilizing an RPU system for hardware accelerated computing, according to an exemplary embodiment of the disclosure. FIG. 10 illustrates a computing node 1000 which comprises a computer system/server 1012, which is operational with numerous other general purpose or special purpose computing system environments or configurations. Examples of well-known computing systems, environments, and/or configurations that may be suitable for use with computer system/server 1012 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1012 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1012 may be practiced in distributed cloud computing environments where tasks are performed by remote processing devices that are linked through a communications network. In a distributed cloud computing environment, program modules may be located in both local and remote computer system storage media including memory storage devices.

In FIG. 10, computer system/server 1012 in computing node 1000 is shown in the form of a general-purpose computing device. The components of computer system/server 1012 may include, but are not limited to, one or more processors or processing units 1016, a system memory 1028, and a bus 1018 that couples various system components including system memory 1028 to the processors 1016.

The bus 1018 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 1012 typically includes a variety of computer system readable media. Such media may be any available media that is accessible by computer system/server 1012, and it includes both volatile and non-volatile media, removable and non-removable media.

The system memory 1028 can include computer system readable media in the form of volatile memory, such as random-access memory (RAM) 1030 and/or cache memory 1032. The computer system/server 1012 may further include other removable/non-removable, volatile/nonvolatile computer system storage media. By way of example only, storage system 1034 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1018 by one or more data media interfaces. As depicted and described herein, memory 1028 may include at least one program product having a set (e.g., at least one) of program modules that are configured to carry out the functions of embodiments of the invention.

The program/utility 1040, having a set (at least one) of program modules 1042, may be stored in memory 1028 by way of example, and not limitation, as well as an operating system, one or more application programs, other program modules, and program data. Each of the operating system, one or more application programs, other program modules, and program data or some combination thereof, may include an implementation of a networking environment. Program modules 1042 generally carry out the functions and/or methodologies of embodiments of the disclosure as described herein.

Computer system/server 1012 may also communicate with one or more external devices 1014 such as a keyboard, a pointing device, a display 1024, etc., one or more devices that enable a user to interact with computer system/server 1012, and/or any devices (e.g., network card, modem, etc.) that enable computer system/server 1012 to communicate with one or more other computing devices. Such communication can occur via Input/Output (I/O) interfaces 1022. Still yet, computer system/server 1012 can communicate with one or more networks such as a local area network (LAN), a general wide area network (WAN), and/or a public network (e.g., the Internet) via network adapter 1020. As depicted, network adapter 1020 communicates with the other components of computer system/server 1012 via bus 1018. It should be understood that although not shown, other hardware and/or software components could be used in conjunction with computer system/server 1012. Examples, include, but are not limited to: microcode, device drivers, redundant processing units, external disk drive arrays, RAID systems, SSD drives, and data archival storage systems, etc.

Additionally, it is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed. For example, a cloud service such as neuromorphic computing-as-a-service or artificial intelligence-as-a-service (AIaaS) can implement RPU systems which utilize exemplary skyrmion-based resistive memory devices as discussed herein Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 11:
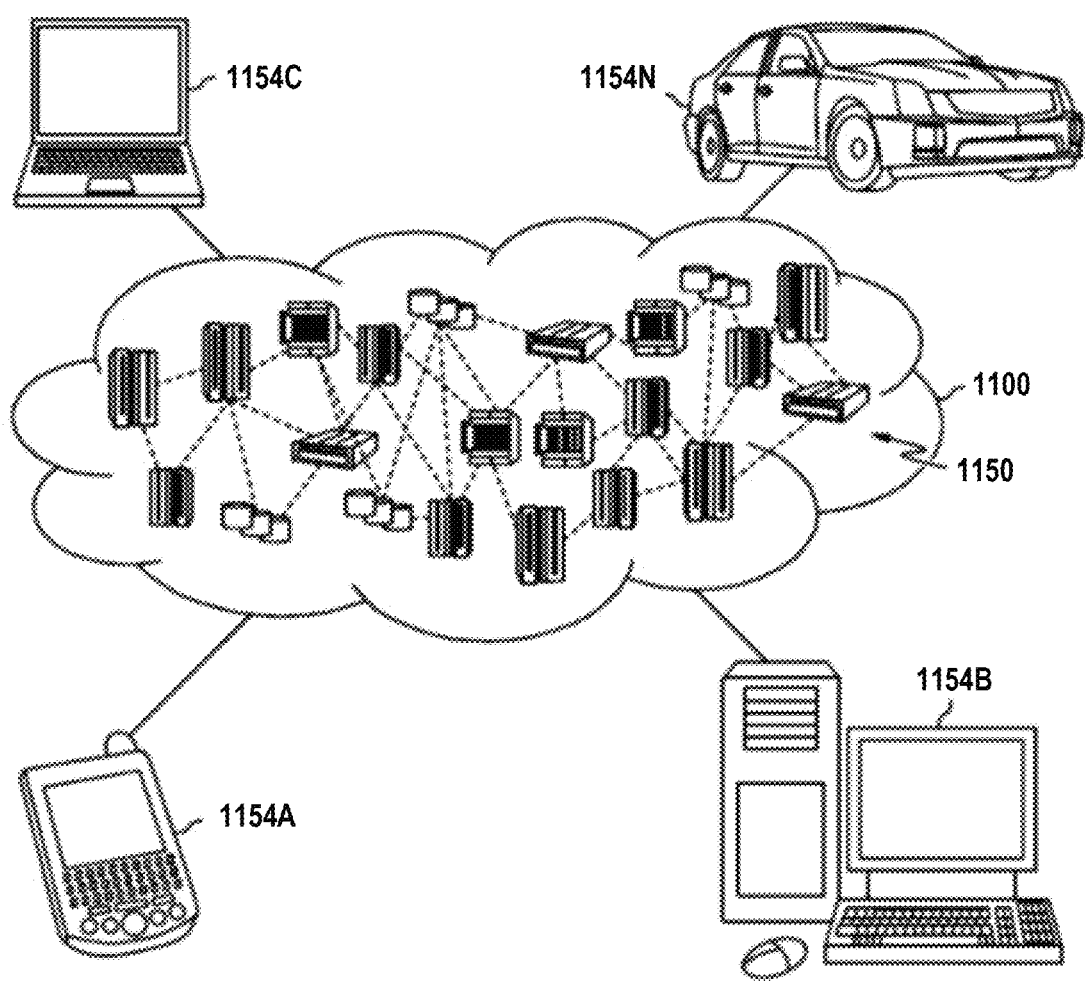
FIG. 11 depicts a cloud computing environment according to an exemplary embodiment of the disclosure.

Referring now to FIG. 11, illustrative cloud computing environment 1100 is depicted. As shown, cloud computing environment 1100 includes one or more cloud computing nodes 1150 with which local computing devices used by cloud consumers, such as, for example, personal digital assistant (PDA) or cellular telephone 1154A, desktop computer 1154B, laptop computer 1154C, and/or automobile computer system 1154N may communicate. Nodes 1150 may communicate with one another. They may be grouped (not shown) physically or virtually, in one or more networks, such as Private, Community, Public, or Hybrid clouds as described hereinabove, or a combination thereof. This allows cloud computing environment 1100 to offer infrastructure, platforms and/or software as services for which a cloud consumer does not need to maintain resources on a local computing device. It is understood that the types of computing devices 1154A-N shown in FIG. 11 are intended to be illustrative only and that computing nodes 1150 and cloud computing environment 1100 can communicate with any type of computerized device over any type of network and/or network addressable connection (e.g., using a web browser).

Figure 12:
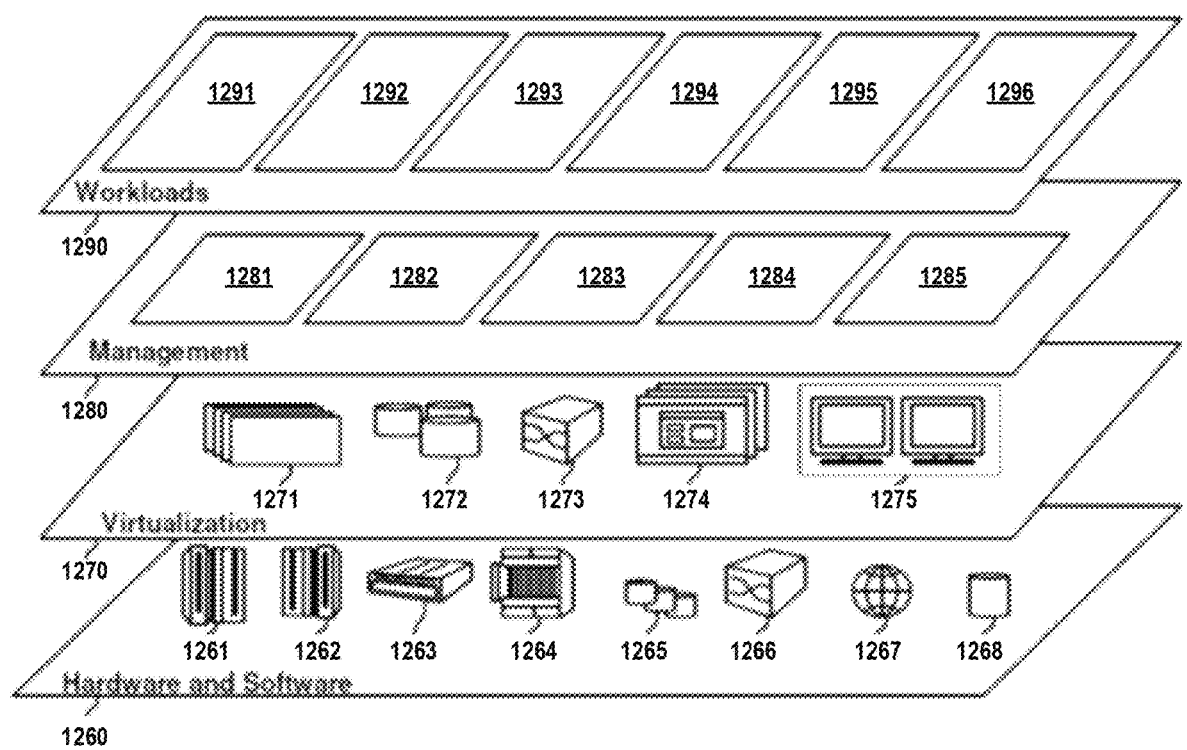
FIG. 12 depicts abstraction model layers according to an exemplary embodiment of the disclosure.

Referring now to FIG. 12, a set of functional abstraction layers provided by cloud computing environment 1100 (FIG. 11) is shown. It should be understood in advance that the components, layers, and functions shown in FIG. 12 are intended to be illustrative only and embodiments of the invention are not limited thereto. As depicted, the following layers and corresponding functions are provided:

Hardware and software layer 1260 includes hardware and software components. Examples of hardware components include: mainframes 1261; RISC (Reduced Instruction Set Computer) architecture based servers 1262; servers 1263; blade servers 1264; storage devices 1265; and networks and networking components 1266. In some embodiments, software components include network application server software 1267 and database software 1268.

Virtualization layer 1270 provides an abstraction layer from which the following examples of virtual entities may be provided: virtual servers 1271; virtual storage 1272; virtual networks 1273, including virtual private networks; virtual applications and operating systems 1274; and virtual clients 1275.

In one example, management layer 1280 may provide the functions described below. Resource provisioning 1281 provides dynamic procurement of computing resources and other resources that are utilized to perform tasks within the cloud computing environment. Metering and Pricing 1282 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1283 provides access to the cloud computing environment for consumers and system administrators. Service level management 1284 provides cloud computing resource allocation and management such that required service levels are met. Service Level Agreement (SLA) planning and fulfillment 1285 provide pre-arrangement for, and procurement of, cloud computing resources for which a future requirement is anticipated in accordance with an SLA.

Workloads layer 1290 provides examples of functionality for which the cloud computing environment may be utilized. Examples of workloads and functions which may be provided from this layer include: mapping and navigation 1291; software development and lifecycle management 1292; virtual classroom education delivery 1293; data analytics processing 1294; transaction processing 1295; and various functions 1296 to support neuromorphic computing applications including, but not limited to, machine learning applications, image classification applications, neural network training applications, artificial intelligence applications, etc., or otherwise provide support for hardware accelerated computing using RPU systems which comprise arrays of non-volatile resistive memory cells that implement, e.g., skyrmion-based resistive memory devices, according to exemplary embodiments of disclosure as discussed herein. Furthermore, in some embodiments, the hardware and software layer 1260 would include the computing systems 100 and 200 of FIGS. 1 and 2 to implement or otherwise support the various workloads and functions 1296 for performing such hardware accelerated computing and analog in-memory computations.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A resistive memory device, comprising:
a magnetic tunnel junction structure comprising a free magnetic layer, wherein the free magnetic layer comprises a magnetic material which hosts multiple topological spin textures that are induced in response to programming pulses applied to the resistive memory device to tune a conductance state of the resistive memory device.

2. The device of claim 1, wherein the magnetic tunnel junction structure comprises:
a first pinned magnetic layer; and
a non-magnetic layer of insulating material disposed between the first pinned magnetic layer and the free magnetic layer;
wherein the first pinned magnetic layer and the free magnetic layer comprise a perpendicular magnetic anisotropy.

3. The device of claim 2, wherein the magnetic tunnel junction structure further comprises a second pinned magnetic layer, wherein the free magnetic layer is disposed between the first and second pinned magnetic layers.

4. The device of claim 3, wherein the first and second pinned magnetic layers each comprise a footprint area which is smaller than a footprint area of the free magnetic layer.

5. The device of claim 2, wherein the free magnetic layer comprises a multilayer structure, wherein the multilayer structure comprises a first heavy metal layer, a second heavy metal layer, and a chiral magnetic layer disposed between the first and second heavy metal layers.

6. The device of claim 5, wherein the first heavy metal layer comprises platinum, the chiral magnetic layer comprises a cobalt-iron-boron alloy, and the second heavy metal layer comprises tantalum.

7. The device of claim 5, wherein the first heavy metal layer comprises platinum, the chiral magnetic layer comprises a cobalt-iron-boron alloy, and the second heavy metal layer comprises iridium.

8. The device of claim 5, wherein the first heavy metal layer comprises platinum, the chiral magnetic layer comprises iron, and the second heavy metal layer comprises iridium.

9. The device of claim 1, wherein the free magnetic layer comprises a single non-centrosymmetric chiral magnetic layer.

10. The device of claim 9, wherein the single non-centrosymmetric chiral magnetic layer comprises one of a cobalt-iron-silicon alloy, and an iron-germanium alloy.

11. The device of claim 1, wherein the topological spin textures comprise skyrmions.

12. A device, comprising:
an array of non-volatile resistive memory cells, wherein at least one non-volatile resistive memory cell comprises a resistive memory device, wherein the resistive memory device comprises a magnetic tunnel junction structure comprising a free magnetic layer, wherein the free magnetic layer comprises a magnetic material which hosts multiple topological spin textures that are induced in response to programming pulses applied to the resistive memory device to tune a conductance state of the resistive memory device.

13. The device of claim 12, wherein the magnetic tunnel junction structure of the resistive memory device comprises:
a pinned magnetic layer; and
a non-magnetic layer of insulating material disposed between the pinned magnetic layer and the free magnetic layer;
wherein the pinned magnetic layer and the free magnetic layer comprise a perpendicular magnetic anisotropy.

14. The device of claim 12, wherein the free magnetic layer comprises a multilayer structure, wherein the multilayer structure comprises a first heavy metal layer, a second heavy metal layer, and a chiral magnetic layer disposed between the first and second heavy metal layers.

15. The device of claim 12, wherein the free magnetic layer comprises a single non-centrosymmetric chiral magnetic layer.

16. The device of claim 12, wherein the device comprises a neuromorphic computing device, wherein the array of non-volatile resistive memory cells comprises an array of artificial synaptic elements, wherein the at least one non-volatile resistive memory cell comprises a synaptic weight encodable by a conductance value of the resistive memory device of the at least one non-volatile memory cell.

17. The device of claim 12, wherein the topological spin textures comprise skyrmions.

18. A method, comprising applying one or more programming pulses to a resistive memory device comprising a free magnetic layer responsive to the programming pulses to configure one or more topological spin textures in the free magnetic layer to tune the conductance state of the resistive memory device.

19. The method of claim 18, wherein applying one or more programming pulses to the resistive memory device configure one or more topological spin textures in the free magnetic layer to tune the conductance state of the resistive memory device comprises:
applying one or more potentiation programming pulses to induce a formation of one or more topological spin textures in the free magnetic layer as a result of current flow in a first direction through the resistive memory device; and
applying one or more depression programming pulses to cause annihilation of one or more existing topological spin textures in the free magnetic layer as a result of current flow in a second direction through the resistive memory device, opposite the first direction.

20. The method of claim 18, wherein the topological spin textures comprise magnetic skyrmions, and wherein the free magnetic layer comprises a chiral magnetic layer.

* * * * *